(12) United States Patent
Cho et al.

(10) Patent No.: US 12,022,685 B2
(45) Date of Patent: Jun. 25, 2024

(54) DISPLAY DEVICE INCLUDING UPPER AND LOWER LIGHT-SHIELDING LAYERS

(71) Applicant: SAMSUNG DISPLAY CO., LTD., Yongin-si (KR)

(72) Inventors: Hyunduck Cho, Yongin-si (KR); Sungmin Kim, Yongin-si (KR); Hongjo Park, Yongin-si (KR); Chiwook An, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 202 days.

(21) Appl. No.: 17/381,471

(22) Filed: Jul. 21, 2021

(65) Prior Publication Data

US 2022/0059805 A1 Feb. 24, 2022

(30) Foreign Application Priority Data

Aug. 19, 2020 (KR) ........................ 10-2020-0104188
Feb. 8, 2021 (KR) ........................ 10-2021-0017868

(51) Int. Cl.
*H10K 50/86* (2023.01)
*H10K 50/84* (2023.01)
(Continued)

(52) U.S. Cl.
CPC .......... *H10K 50/86* (2023.02); *H10K 50/844* (2023.02); *H10K 59/352* (2023.02); *H10K 59/40* (2023.02);
(Continued)

(58) Field of Classification Search
CPC .... H10K 50/86; H10K 50/844; H10K 50/865; H10K 50/868; H10K 50/8426; H10K 50/15; H10K 50/16; H10K 50/17; H10K 50/171; H10K 59/40; H10K 59/123; H10K 59/126; H10K 59/12; H10K 59/352; H10K 59/1216; H10K 59/8792; H10K 59/38; H10K 59/122; H10K 2102/351; G02F 1/133331
See application file for complete search history.

(56) References Cited

U.S. PATENT DOCUMENTS 10,388,913 B2 8/2019 Jung et al.
10,553,662 B2 * 2/2020 Lee ...................... H10K 59/126
(Continued)

FOREIGN PATENT DOCUMENTS

KR 20190033118 A * 3/2019 ............. H10K 50/84
KR 20190042788 A * 4/2019 ............. H10K 50/84
(Continued)

*Primary Examiner* — Ida M Soward
(74) *Attorney, Agent, or Firm* — CANTOR COLBURN LLP

(57) ABSTRACT

A display device includes: a substrate; a display layer arranged above the substrate and including a display element; an encapsulation layer above the display layer; a lower light-shielding layer above the encapsulation layer; an upper light-shielding layer at least partially overlapping the lower light-shielding layer in a plan view and arranged above the lower light-shielding layer; and an organic layer arranged between the lower light-shielding layer and the upper light-shielding layer and separating the lower light-shielding layer and the upper light-shielding layer from each other.

18 Claims, 26 Drawing Sheets

(51) Int. Cl.
- *H10K 50/844* (2023.01)
- *H10K 59/35* (2023.01)
- *H10K 59/40* (2023.01)
- *H10K 71/00* (2023.01)
- *G02F 1/1333* (2006.01)
- *H10K 50/15* (2023.01)
- *H10K 50/16* (2023.01)
- *H10K 50/17* (2023.01)
- *H10K 50/80* (2023.01)
- *H10K 50/842* (2023.01)
- *H10K 59/121* (2023.01)
- *H10K 59/122* (2023.01)
- *H10K 59/38* (2023.01)
- *H10K 59/80* (2023.01)
- *H10K 102/00* (2023.01)

(52) U.S. Cl.
CPC ....... *H10K 71/00* (2023.02); *G02F 1/133331* (2021.01); *H10K 50/15* (2023.02); *H10K 50/16* (2023.02); *H10K 50/17* (2023.02); *H10K 50/171* (2023.02); *H10K 50/8426* (2023.02); *H10K 50/868* (2023.02); *H10K 59/1216* (2023.02); *H10K 59/122* (2023.02); *H10K 59/38* (2023.02); *H10K 59/8792* (2023.02); *H10K 2102/351* (2023.02)

(56) References Cited

U.S. PATENT DOCUMENTS

| | | | |
|---|---|---|---|
| 2015/0060827 A1* | 3/2015 | Sasaki | H10K 50/865 257/40 |
| 2019/0115411 A1* | 4/2019 | Park | H10K 59/40 |
| 2019/0214440 A1* | 7/2019 | Lee | G06F 3/044 |
| 2019/0221779 A1* | 7/2019 | Jang | H10K 59/38 |
| 2020/0052058 A1* | 2/2020 | Lee | H10K 50/865 |
| 2020/0168667 A1* | 5/2020 | Kim | H10K 71/00 |

FOREIGN PATENT DOCUMENTS

| | | | | |
|---|---|---|---|---|
| KR | 20190048391 A | * | 5/2019 | ....... G02F 1/133512 |
| KR | 20190080312 A | * | 7/2019 | ........... H10K 59/122 |

* cited by examiner

DISPLAY DEVICE INCLUDING UPPER AND LOWER LIGHT-SHIELDING LAYERS

This application claims priority to Korean Patent Application No. 10-2020-0104188, filed on Aug. 19, 2020 and Korean Patent Application No. 10-2021-0017868, filed on Feb. 8, 2021, and all the benefits accruing therefrom under 35 U.S.C. § 119, the contents of which in their entirety are herein incorporated by reference.

BACKGROUND

1. Field

One or more embodiments relate to a display device and a method of manufacturing the display device.

2. Description of the Related Art

As a display device has become thinner and lighter, the usage thereof has steadily diversified and expanded. In addition, as the display device is used in various fields, demands for the display device that provides a high-quality image have increased.

Display elements included in the display device may emit light and display an image. Light emitted from the display device may progress in a direction perpendicular to a front surface of the display device, or may progress in a direction oblique to the front surface of the display device.

SUMMARY

When light emitted by a display element progresses in a direction oblique to a front surface of a display device, the light emitted from the display element may reach not only a user using the display device but also another person around the user. Thus, information provided by the display device may be shared with the other person.

One or more embodiments include a display device in which the progress of light emitted from a display element in a direction oblique to a front surface of the display device may be reduced, and a method of manufacturing the display device.

Additional aspects of the present disclosure will be set forth in part in the description that follows and, in part, will be apparent from the description, or may be learned by practice of the embodiments of the present disclosure described herein.

According to an embodiment, a display device includes a substrate, a display layer arranged above the substrate and including a display element, an encapsulation layer above the display layer, a lower light-shielding layer above the encapsulation layer, an upper light-shielding layer at least partially overlapping the lower light-shielding layer in a plan view and arranged above the lower light-shielding layer, and an organic layer arranged between the lower light-shielding layer and the upper light-shielding layer and separating the lower light-shielding layer and the upper light-shielding layer from each other.

The display device may further include an inorganic layer between the upper light-shielding layer and the organic layer.

A thickness of the organic layer may be greater than a thickness of the inorganic layer.

The encapsulation layer may include at least one organic encapsulation layer and at least one inorganic encapsulation layer, and a thickness of the organic layer may be greater than a thickness of the at least one organic encapsulation layer.

The display device may further include a touch conductive layer above the encapsulation layer, and the lower light-shielding layer may cover the touch conductive layer.

The display device may further include a touch insulating layer between the lower light-shielding layer and the organic layer.

A thickness of the organic layer may be greater than a thickness of the touch insulating layer.

The touch conductive layer may define a conductive layer hole overlapping the display element in the plan view.

The display element may include a pixel electrode, an emission layer, and an opposite electrode, the display layer may include a pixel-defining layer which covers an edge of the pixel electrode and defines an opening overlapping a central portion of the pixel electrode in the plan view, and at least one of the lower light-shielding layer and the upper light-shielding layer may overlap the pixel-defining layer in the plan view.

The display device may further include a planarization layer covering the upper light-shielding layer.

According to another embodiment, a display device includes a substrate, a display layer arranged above the substrate and including a display element, an encapsulation layer arranged above the display layer and including at least one inorganic encapsulation layer and at least one organic encapsulation layer, an organic layer arranged above the encapsulation layer and having a thickness greater than a thickness of the at least one organic encapsulation layer, an inorganic layer above the organic layer, and at least one of a lower light-shielding layer arranged between the encapsulation layer and the organic layer and an upper light-shielding layer arranged above the inorganic layer.

The display device may further include a touch conductive layer between the encapsulation layer and the organic layer, and a touch insulating layer covering the touch conductive layer.

The lower light-shielding layer may cover the touch conductive layer, and the touch insulating layer may cover the lower light-shielding layer.

The display element may include a pixel electrode, an emission layer, and an opposite electrode, the display layer may include a pixel-defining layer which covers an edge of the pixel electrode and defines an opening overlapping a central portion of the pixel electrode in a plan view, and at least one of the lower light-shielding layer and the upper light-shielding layer may overlap the pixel-defining layer in the plan view.

The display device may further include a planarization layer covering the upper light-shielding layer.

According to another embodiment, a display device includes a substrate including a first display area and a second display area adjacent to the first display area, a display layer including a first display element including a first pixel electrode arranged in the first display area, a second display element including a second pixel electrode arranged in the second display area, and a pixel-defining layer defining a first opening and a second opening overlapping the first pixel electrode and the second pixel electrode, respectively, in a plan view, an encapsulation layer arranged above the display layer and including at least one inorganic encapsulation layer and at least one organic encapsulation layer, and a first light-shielding pattern arranged above the at least one inorganic encapsulation layer, overlapping one of the first display area and the second display area in the plan view, and defining a first hole overlapping one of the first display element and the second display element in the plan view.

The first light-shielding pattern may be arranged in the first display area, the first hole may overlap the first display element in the plan view, and a width of the first opening may be equal to a width of the first hole.

The display device may further include a first upper light-shielding pattern arranged above the first light-shielding pattern and defining a first upper hole overlapping the first hole in the plan view.

The encapsulation layer may include a first inorganic encapsulation layer, a first organic encapsulation layer, a second inorganic encapsulation layer, a third inorganic encapsulation layer, a second organic encapsulation layer, and a fourth inorganic encapsulation layer that are sequentially stacked, and the first light-shielding pattern may be arranged between the second inorganic encapsulation layer and the third inorganic encapsulation layer.

The display device may further include a second light-shielding pattern arranged above the at least one inorganic encapsulation layer, overlapping another one of the first display area and the second display area in the plan view, and defining a second hole overlapping another one of the first display element and the second display element in the plan view, and a ratio (Y/X) of a width of the first hole (Y) to a width (X) of the first opening may be less than a ratio (W/Z) of a width (W) of the second hole to a width (Z) of the second opening.

According to another embodiment, a method of manufacturing a display device includes preparing a display substrate, where the display substrate includes a substrate including a display area and a pad area outside the display area, a display layer arranged in the display area and including a display element, and a pad arranged in the pad area, forming an organic layer overlapping the display layer, forming an inorganic layer above the organic layer and the pad, forming an upper light-shielding layer above the inorganic layer, and removing the inorganic layer arranged above the pad.

The forming of the upper light-shielding layer may include forming a first photoresist layer above the inorganic layer, placing a first mask above the first photoresist layer and exposing at least a portion of the first photoresist layer to light, and removing the first photoresist layer arranged in the pad area.

The method may further include forming a planarization layer covering the upper light-shielding layer.

The forming of the planarization layer may include forming a second photoresist layer above the upper light-shielding layer and the inorganic layer, placing a second mask above the second photoresist layer and exposing at least a portion of the second photoresist layer to light, and removing the second photoresist layer arranged in the pad area. The removing of the inorganic layer arranged above the pad may include placing the second mask above the inorganic layer arranged above the pad and etching the inorganic layer arranged above the pad.

The organic layer may be formed by an inkjet printing process.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
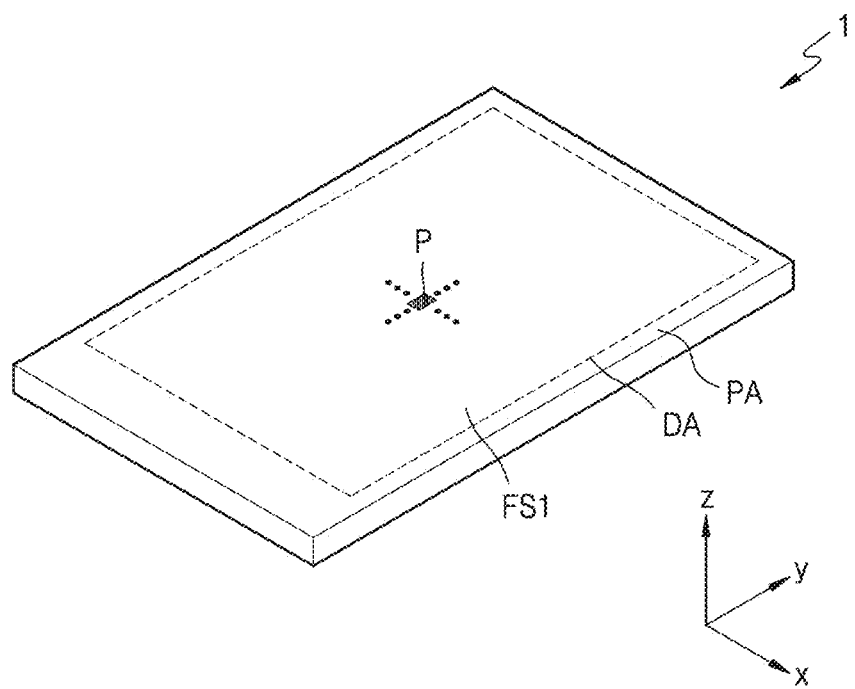
FIG. 1 is a perspective view schematically illustrating a display device according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, region, or element is referred to as being "formed on" another layer, area, or element, it can be directly or indirectly formed on the other layer, region, or element. That is, for example, one or more intervening layers, regions, or elements may be present therebetween.

Sizes of elements in the drawings may be exaggerated or contracted for convenience of explanation. In other words, because sizes and thicknesses of components in the drawings are arbitrarily illustrated for convenience of explanation, the following embodiments are not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

A display device displays an image and may be a portable mobile device such as game machines, multimedia devices, and micro personal computers ("PCs"). A display device to be described later below may include liquid crystal displays, electrophoretic displays, organic light-emitting displays, inorganic electroluminescent ("EL") displays, field emission displays, surface-conduction electron-emitter displays, quantum dot displays, plasma displays, cathode ray displays, etc. Hereinbelow, an organic light-emitting display will be described as an example of a display device according to an embodiment, but display devices of various types as described above may be used in embodiments.

FIG. 1 is a perspective view schematically illustrating a display device 1 according to an embodiment.

Referring to FIG. 1, the display device 1 may include a display area DA and a peripheral area PA. A sub-pixel P may be arranged in the display area DA. In an embodiment, the sub-pixel P may be arranged on a front surface FS1 of the display device 1.

In an embodiment, a plurality of sub-pixels P may be arranged in the display area DA. The sub-pixel P may include a display element. The display device 1 may provide an image using light emitted by the sub-pixel P. In an embodiment, the light emitted by the sub-pixel P may progress in a direction perpendicular to the front surface FS1 of the display device 1 (for example, a z direction) and/or a direction substantially perpendicular to the front surface FS1 of the display device 1. In an embodiment, the light emitted by the sub-pixel P may progress in a direction oblique to the front surface FS1 of the display device 1 (for example, a direction oblique with respect to the z direction).

In an embodiment, the sub-pixel P may emit one of red, green, and blue light via the display element. In an embodiment, the sub-pixel P may emit one of red, green, blue, and white light via the display element. In the present disclosure, the sub-pixel P may be defined by an emission area of a display element emitting one of red, green, blue, and white light as described above.

The sub-pixel P may include a light-emitting diode as a display element capable of emitting light of a color. The light-emitting diode may include an organic light-emitting diode including an organic material as an emission layer. In some embodiments, the light-emitting diode may include an inorganic light-emitting diode. In some embodiments, the light-emitting diode may include quantum dots as an emission layer. For convenience of description, a case where the light-emitting diode includes an organic light-emitting diode will be mainly described below.

The peripheral area PA may be an area that does not provide an image. The peripheral area PA may at least partially surround the display area DA. In an embodiment, the peripheral area PA may entirely surround the display area DA. A driver for providing electrical signals or power to the sub-pixel P, etc. may be arranged in the peripheral area PA. In addition, the peripheral area PA may include a pad area in which a pad is arranged.

Figure 2A:
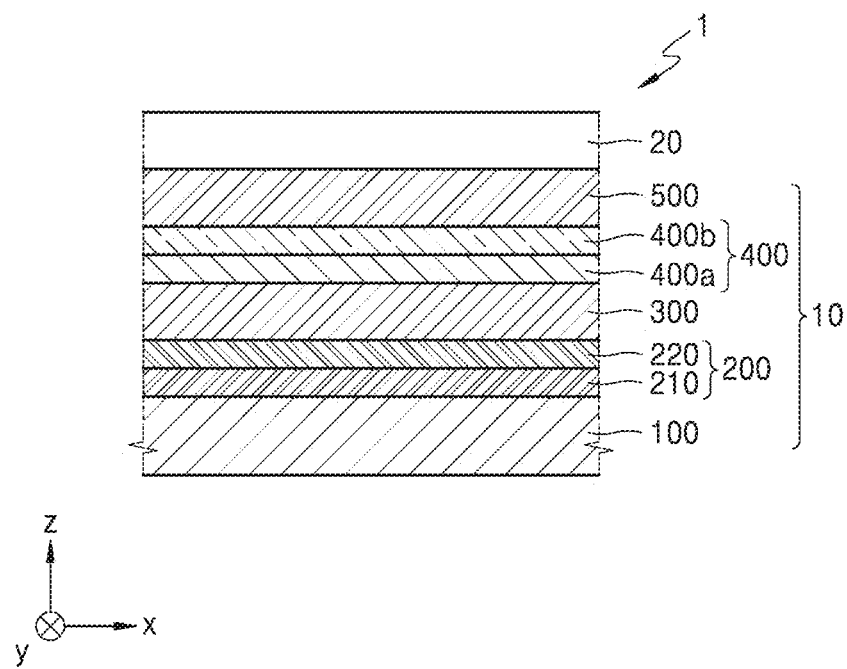
FIGS. 2A and 2B are cross-sectional views schematically illustrating a display device according to embodiments.
Figure 2B:
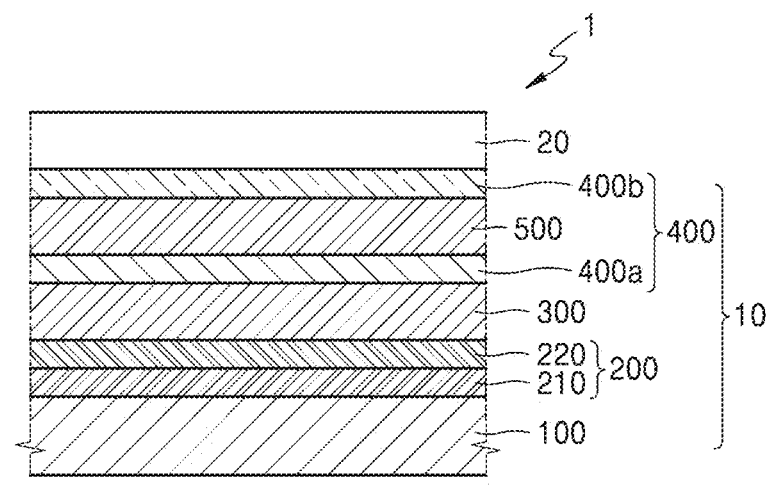

FIGS. 2A and 2B are cross-sectional views schematically illustrating a display device 1 according to embodiments.

Referring to FIG. 2A, the display device 1 may include a display panel 10 and a cover window 20. The display panel 10 may include a substrate 100, a display layer 200, an encapsulation layer 300, a functional layer 400, and an anti-reflection layer 500.

The substrate 100 may include glass or a polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. In an embodiment, the substrate 100 may have a multi-layer structure including a base layer including the polymer resin described above and a barrier layer (not shown). The substrate 100 including the polymer resin may be flexible, rollable, or bendable.

The display layer 200 may be arranged above the substrate 100. The display layer 200 may include a pixel circuit layer 210 and a display element layer 220. The pixel circuit layer 210 may include a plurality of pixel circuits. The display element layer 220 may include a plurality of display elements connected to the plurality of pixel circuits, respectively. Each of the display elements provided in the display element layer 220 may define a sub-pixel. The pixel circuit layer 210 may include a plurality of thin-film transistors and a plurality of storage capacitors.

The encapsulation layer 300 may be arranged above the display layer 200. In an embodiment, the encapsulation layer 300 may include at least one inorganic encapsulation layer and at least one organic encapsulation layer. The at least one inorganic encapsulation layer may include one or more inorganic materials from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include an acryl-based resin, an epoxy-based resin, polyimide, polyethylene, etc. In an embodiment, the at least one organic encapsulation layer may include acrylate.

In another embodiment, the encapsulation layer 300 may have a structure in which the substrate 100 and an upper substrate that is a transparent member are coupled to each other by an encapsulation member so that an inner space between the substrate 100 and the upper substrate is sealed. In this case, a moisture absorbent, a filler, etc. may be located in the inner space. The encapsulation member may include a sealant, and in another embodiment, may include a material cured by laser. For example, the encapsulation member may include frit. For example, the encapsulation member may include a urethane-based resin, an epoxy-based resin, and an acryl-based resin, which are organic sealants, or silicon, etc., which is an inorganic sealant. For example, the urethane-based resin may include urethane acrylate, etc. For example, the acryl-based resin may include butyl acrylate, ethylhexyl acrylate, etc. In addition, the encapsulation member may include a material cured by heat.

The functional layer 400 may be arranged above the encapsulation layer 300. The functional layer 400 may include a first layer 400a and a second layer 400b. In an embodiment, at least one of the first layer 400a and the second layer 400b may include a touch sensor layer. The touch sensor layer senses a touch input of a user and may detect the touch input of the user by using at least one of various touch methods such as a resistive film-type method, a capacitive-type method, or the like. In an embodiment, at least one of the first layer 400a and the second layer 400b may include an optical layer. The optical layer may have a structure for controlling a direction of light emitted from display elements. In an embodiment, the optical layer may include a light-shielding layer.

In an embodiment, the functional layer 400 may be provided so that some elements of the touch sensor layer and some elements of the optical layer are shared with each other. In other words, the functional layer 400 may include a touch sensor layer capable of sensing a touch input and an optical layer capable of improving optical performance. The functional layer 400 may include sensing electrodes for sensing a touch input and a light-shielding layer for adjusting a direction of light emitted from the display elements.

The anti-reflection layer 500 may be arranged above the functional layer 400. The anti-reflection layer 500 may reduce a reflectance of light (external light) incident toward the display panel 10 from the outside.

In some embodiments, the anti-reflection layer 500 may include a polarizing film. The polarizing film may include a phase delay film, such as a linear polarization plate and a quarter-wave (λ/4) plate. The phase delay film may be arranged above the functional layer 400, and the linear polarization plate may be arranged above the phase delay film.

In some embodiments, the anti-reflection layer 500 may include a filter layer including a black matrix and color filters. The color filters may be arranged by taking into account a color of light emitted by each of the sub-pixels. For example, the filter layer may include a red, green, or blue color filter.

In an embodiment, when the anti-reflection layer 500 includes a black matrix and color filters, the anti-reflection layer 500 may be arranged between the first layer 400a and the second layer 400b, as shown in FIG. 2B. In this case, elements of the anti-reflection layer 500 and elements of the optical layer may be at least partially shared with each other.

The cover window 20 may be arranged above the display panel 10. In an embodiment, the cover window 20 may be adhered to at least one of elements therebelow, for example, the anti-reflection layer 500 and the functional layer 400, by using an optically clear adhesive ("OCA"). The cover window 20 may protect the display panel 10. The cover window 20 may include at least one of glass, sapphire, and plastic. For example, the cover window 20 may include ultra-thin glass ("UTG") or colorless polyimide ("CPI").

Figure 3:
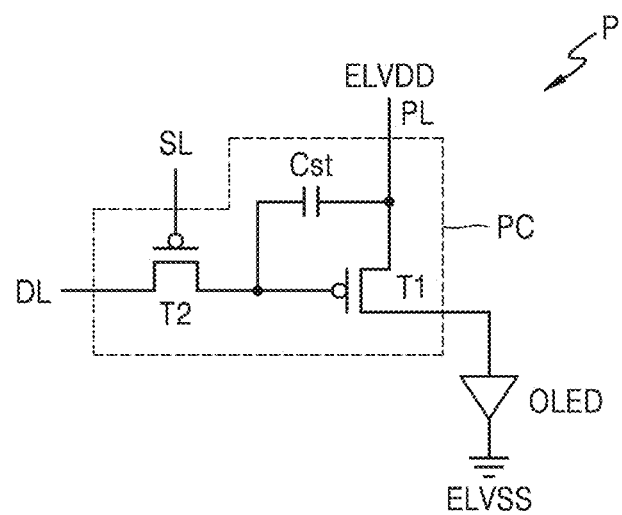
FIG. 3 is an equivalent circuit diagram schematically illustrating a sub-pixel according to an embodiment.

FIG. 3 is an equivalent circuit diagram schematically illustrating a sub-pixel P according to an embodiment.

Referring to FIG. 3, the sub-pixel P may include a pixel circuit PC and an organic light-emitting diode OLED as a display element.

The pixel circuit PC may include a driving thin-film transistor T1, a switching thin-film transistor T2, and a storage capacitor Cst. For example, each sub-pixel P may emit one of red, green, and blue light, or may emit one of red, green, blue, and white light from the organic light-emitting diode OLED.

The switching thin-film transistor T2 is connected to a scan line SL and a data line DL and may transfer, according to a scan signal or a switching voltage received via the scan line SL, a data signal or a data voltage received via the data line DL to the driving thin-film transistor T1. The storage capacitor Cst is connected to the switching thin-film transistor T2 and a driving voltage line PL and may store a voltage corresponding to a voltage difference between a voltage received via the switching thin-film transistor T2 and a first power voltage ELVDD applied to the driving voltage line PL.

The driving thin-film transistor T1 is connected to the driving voltage line PL and the storage capacitor Cst and may control a driving current flowing from the driving voltage line PL to the organic light-emitting diode OLED corresponding to the voltage stored in the storage capacitor Cst. The organic light-emitting diode OLED may emit light having a luminance according to the driving current. An opposite electrode (e.g., a cathode) of the organic light-emitting diode OLED may receive a second power supply voltage ELVSS.

Figure 4:
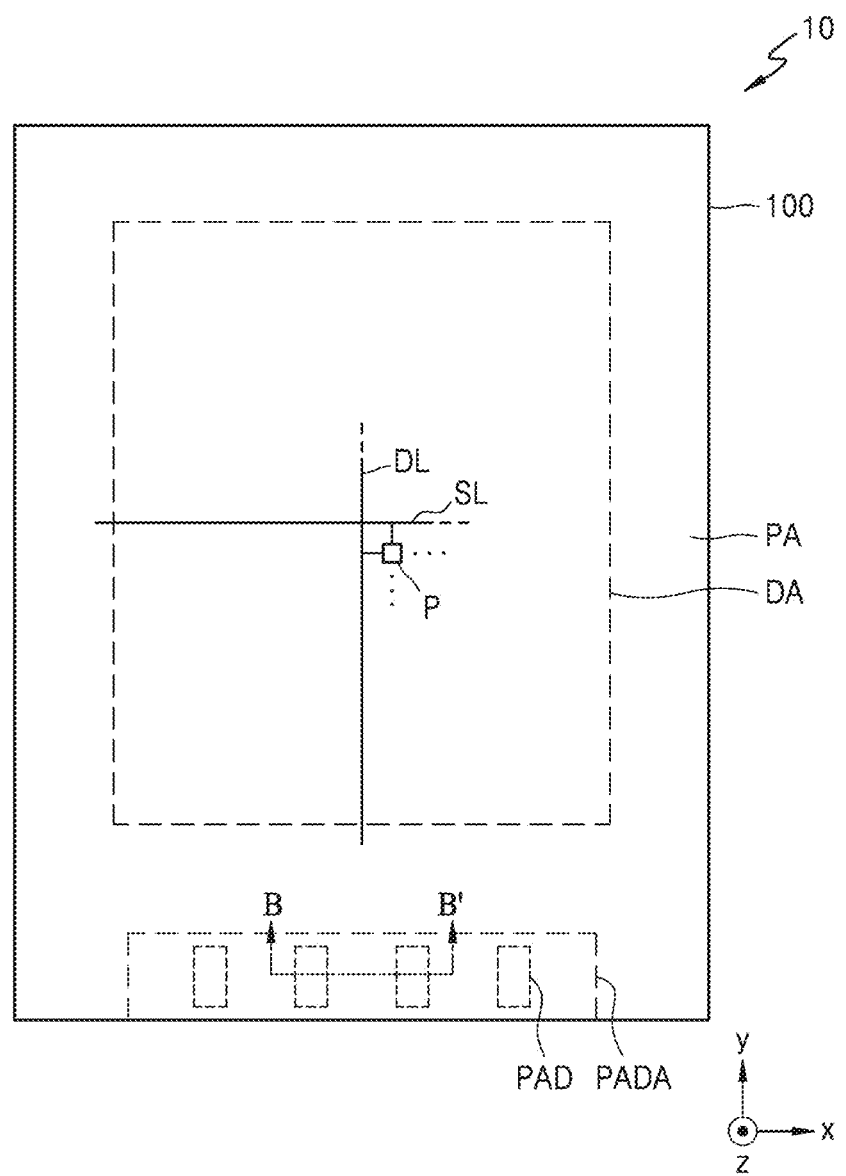
FIG. 4 is a plan view schematically illustrating a display panel according to an embodiment.

FIG. 4 is a plan view schematically illustrating a display panel 10 according to an embodiment.

Referring to FIG. 4, the display panel 10 may include a substrate 100 and a multi-layer film above the substrate 100. A display area DA and a peripheral area PA may be defined in the substrate 100 and/or the multi-layer film. For example, the substrate 100 may include the display area DA and the peripheral area PA. A case where the display area DA and the peripheral area PA are defined in the substrate 100 will be mainly described in detail below.

A sub-pixel P may be arranged in the display area DA, and a plurality of sub-pixels P may display an image. Each of the sub-pixels P may be connected to a scan line SL extending in a first direction (for example, an x direction or a -x direction) and a data line DL extending in a second direction (for example, a y direction or a -y direction).

The peripheral area PA may be arranged outside the display area DA. The peripheral area PA may at least partially surround the display area DA. In an embodiment, the peripheral area PA may entirely surround the display area DA. A scan driver (not shown) providing a scan signal to each of the sub-pixels P may be arranged in the peripheral area PA. A data driver (not shown) providing a data signal to the sub-pixels P may be arranged in the peripheral area PA. The peripheral area PA may include a pad area PADA.

The pad area PADA may be arranged outside the display area DA. In an embodiment, a pad PAD may be arranged in the pad area PADA. The pad PAD may be exposed by not being covered with an insulating layer, and electrically connected to a printed circuit board or a driver integrated chip ("IC"). Signals and/or a voltage received from the printed circuit board or the driver IC via the pad PAD may be transmitted to the sub-pixel P arranged in the display area DA through a line (not shown) connected to the pad PAD.

Figure 5:
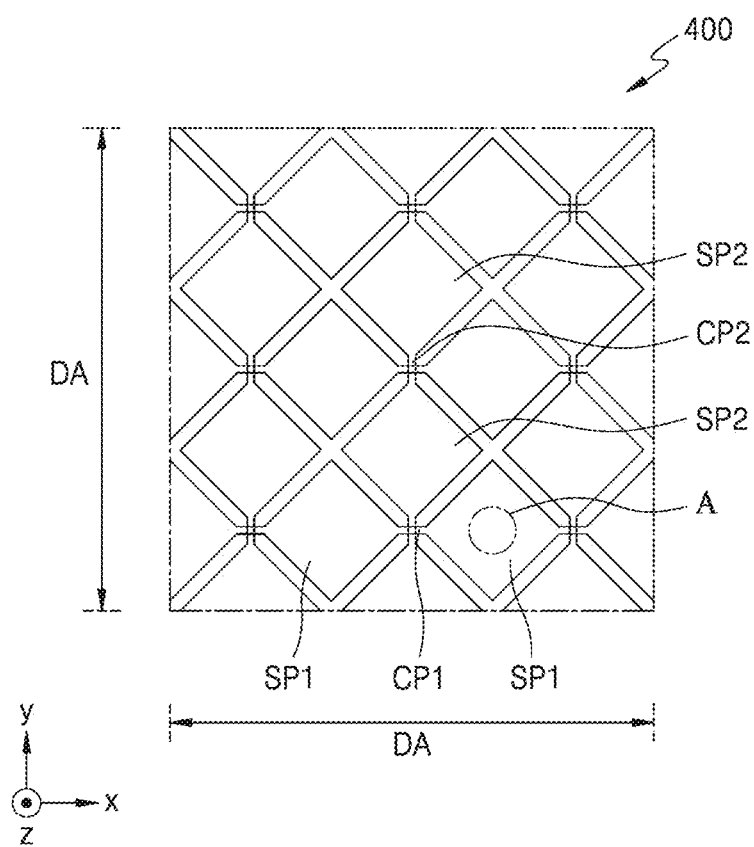
FIG. 5 is a plan view schematically illustrating part of a functional layer according to an embodiment.
Figure 6:
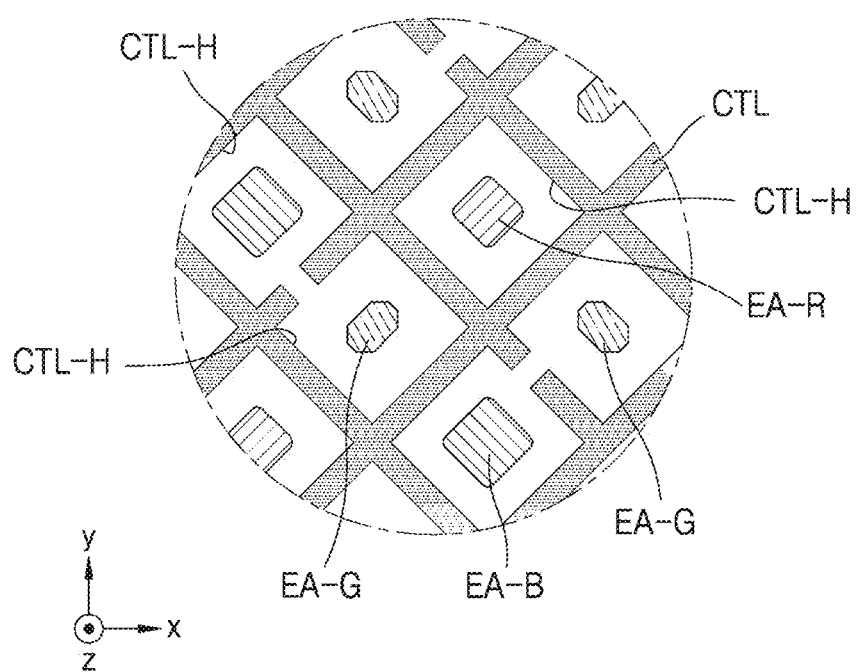
FIG. 6 is an enlarged plan view of a region in FIG. 5 according to an embodiment.

FIG. 5 is a plan view schematically illustrating part of a functional layer 400 according to an embodiment. FIG. 6 is an enlarged plan view of region A in FIG. 5. FIG. 5 schematically illustrates touch electrodes included in the functional layer 400.

Referring to FIG. 5, the functional layer 400 may include a plurality of first sensing electrodes SP1 arranged in a first direction, and a plurality of second sensing electrodes SP2 arranged in a second direction crossing the first direction (e.g., the x direction or −x direction). In an embodiment, the first direction and the second direction may form an acute angle. In an embodiment, the first direction and the second direction may form a right angle or an obtuse angle. A case where the first direction (e.g., the x direction or −x direction) and the second direction (e.g., the y direction or −y direction) are perpendicular to each other will be mainly described in detail below.

First sensing electrodes SP1 that are adjacent to each other may be electrically connected to each other through a first connection electrode CP1. Second sensing electrodes SP2 that are adjacent to each other may be electrically connected to each other through a second connection electrode CP2.

Each of the first sensing electrodes SP1 and the second sensing electrodes SP2 includes a conductive layer, which may include a metal layer and/or a transparent conductive layer.

The metal layer may include molybdenum (Mo), silver (Ag), titanium (Ti), copper (Cu), aluminum (Al), and any alloys thereof. The transparent conductive layer may include a transparent conductive oxide, such as indium tin oxide ("ITO"), indium zinc oxide ("IZO"), zinc oxide (ZnO), indium tin zinc oxide ("ITZO"), or the like. In addition, the transparent conductive layer may include a conductive polymer such as poly(3,4-ethylenedioxythiophene) ("PEDOT"), a metal nanowire, a carbon nanotube, graphene, or the like. Each of the first connection electrodes CP1 and the second connection electrodes CP2 may include a conductive oxide, such as the metal layer or the transparent conductive layer described above.

Referring to FIG. 6, each of sensing electrodes and connection electrodes may have a mesh structure defining a plurality of electrode holes. For example, each of the first sensing electrodes SP1 may be formed on a touch conductive layer CTL. The touch conductive layer CTL may define a plurality of conductive layer holes CTL-H and body portions. The body portions may at least partially surround each of the conductive layer holes CTL-H. The body portions may define each of the conductive layer holes CTL-H. Thus, the body portions may be connected to each other and form a mesh structure. Similarly, each of the second sensing electrodes SP2, each of the first connection electrodes CP1, and each of the second connection electrodes CP2 may also have a mesh structure.

Each of the conductive layer holes CTL-H of the touch conductive layer CTL may overlap an emission area of each display element. For example, each of the conductive layer holes CTL-H may overlap an emission area EA-R of a display element emitting red light, an emission area EA-G of a display element emitting green light, or an emission area EA-B of a display element emitting blue light.

At least one of the plurality of conductive layer holes CTL-H may be partially surrounded by a body portion of the touch conductive layer CTL, and neighboring conductive layer holes CTL-H may be spatially connected to each other as shown in FIG. 6. Unlike shown, the at least one of the conductive layer holes CTL-H may be entirely surrounded by the body portion, and may not be spatially connected to each other.

Figure 7:
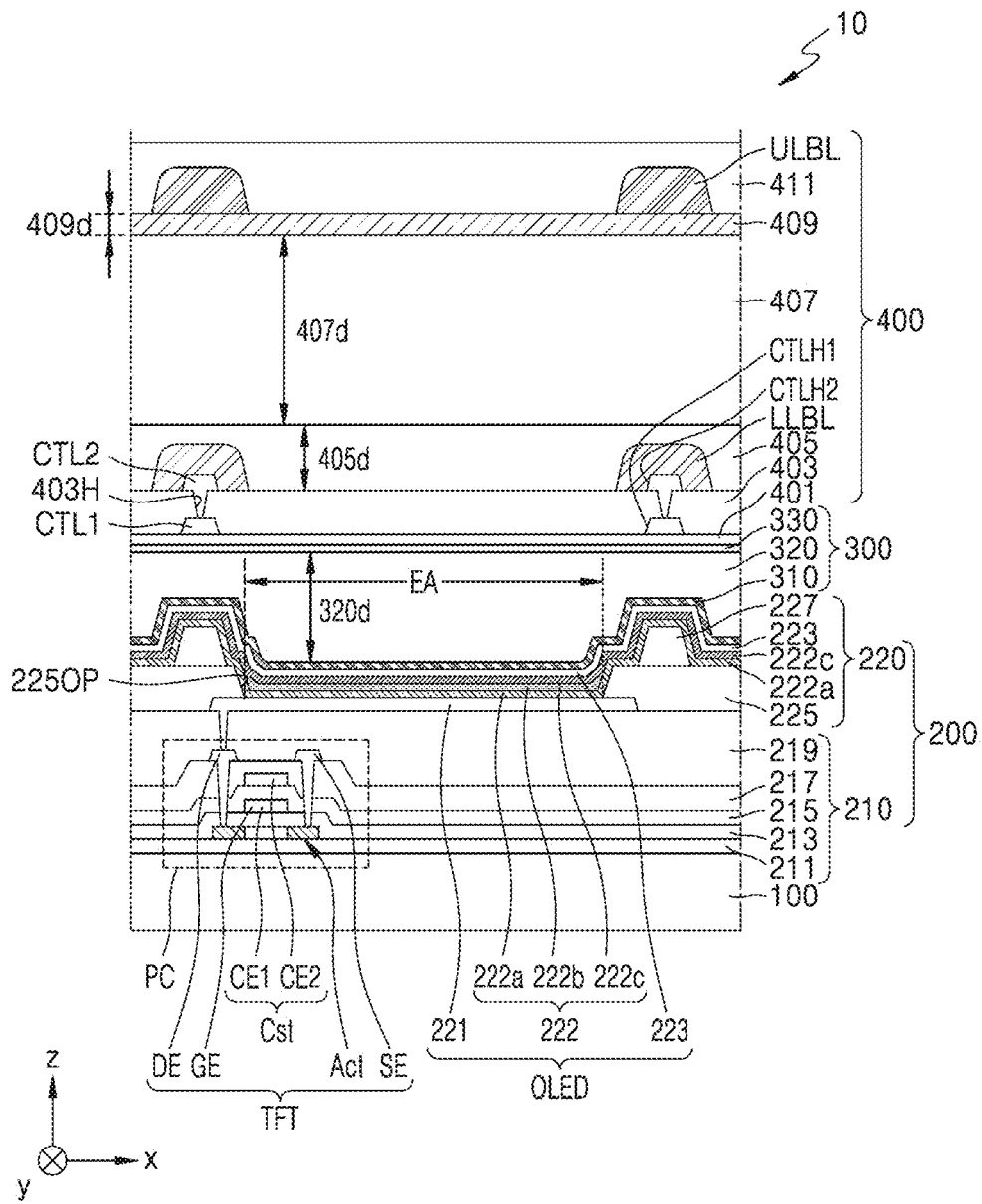
FIG. 7 is a cross-sectional view schematically illustrating a display panel according to an embodiment.
Figure 8:
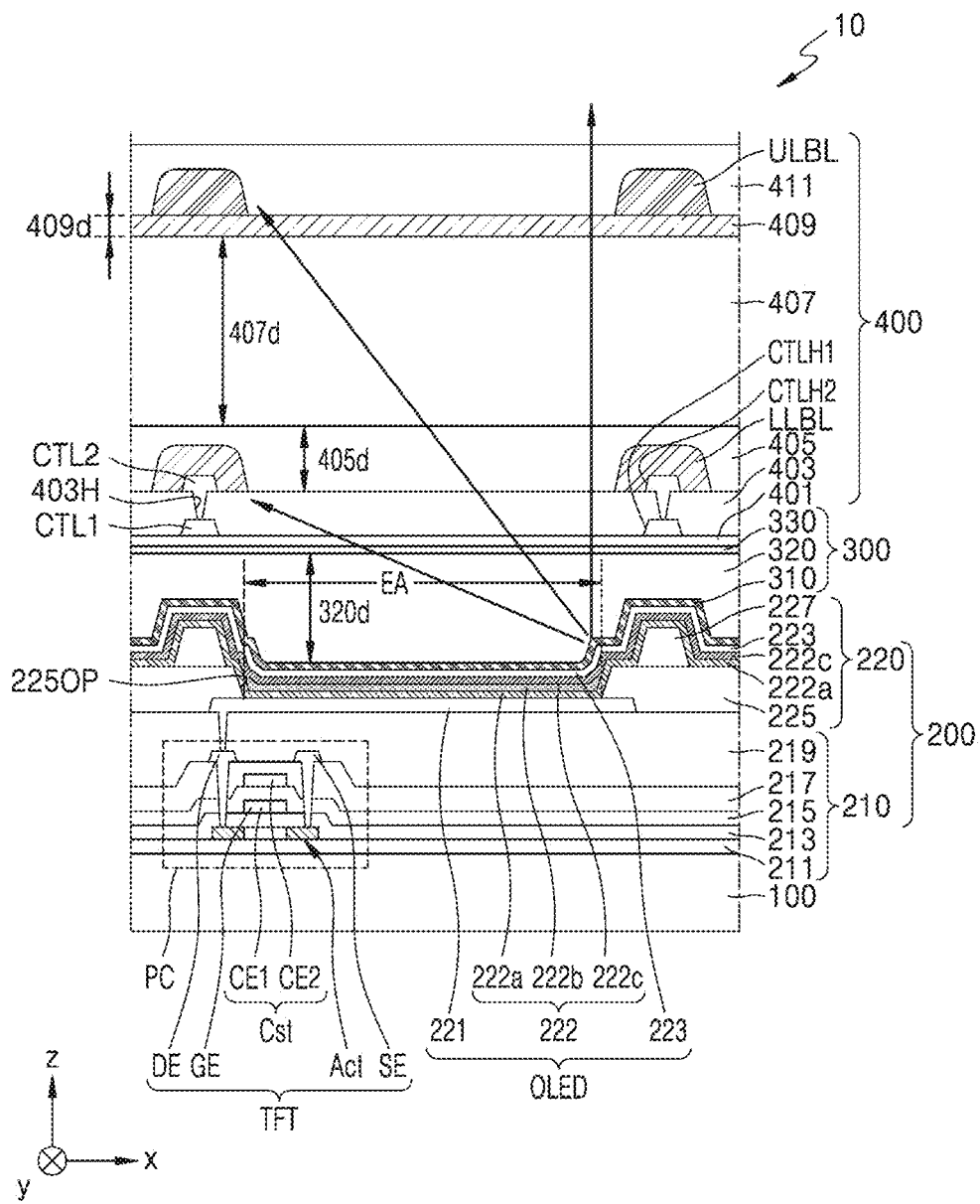
FIG. 8 is a cross-sectional view illustrating a display panel and light emitted from an organic light-emitting diode, according to an embodiment.

FIG. 7 is a cross-sectional view schematically illustrating a display panel 10 according to an embodiment. FIG. 8 is a cross-sectional view illustrating a display panel 10 and light emitted from an organic light-emitting diode OLED, according to an embodiment. In FIG. 7, the same reference numerals as those of FIG. 2A denote the same elements, and redundant descriptions thereof will be omitted.

Referring to FIG. 7, the display panel 10 may include a substrate 100, a display layer 200, an encapsulation layer 300, and a functional layer 400. The display layer 200 may include a pixel circuit layer 210 and a display element layer 220.

The pixel circuit layer 210 may be arranged above the substrate 100. The pixel circuit layer 210 may include a buffer layer 211, a first gate insulating layer 213, a second gate insulating layer 215, an interlayer-insulating layer 217, an organic insulating layer 219, and a pixel circuit PC. The pixel circuit PC may include a thin-film transistor TFT and a storage capacitor Cst.

The buffer layer 211 may be arranged above the substrate 100. The buffer layer 211 may include an inorganic insulating material such as $SiN_x$, SiON, and $SiO_2$, and may be a single layer or multiple layers including the aforementioned inorganic insulating material.

The thin-film transistor TFT may include a semiconductor layer Act, and the semiconductor layer Act may be arranged above the buffer layer 211. The semiconductor layer Act may include polysilicon. In some embodiments, the semiconductor layer Act may include amorphous silicon, an oxide semiconductor, an organic semiconductor, etc. The semiconductor layer Act may include a channel area, a drain area, and a source area. The drain area and the source area are arranged at opposite sides of the channel area, respectively.

A gate electrode GE may overlap the channel area in a plan view. The gate electrode GE may include a low-resistance metal material. The gate electrode GE may include a conductive material including Mo, Al, Cu, Ti, etc., and may have multiple layers or a single layer including the above conductive material.

The first gate insulating layer 213 between the semiconductor layer Act and the gate electrode GE may include an inorganic insulating material, such as $SiO_2$, $SiN_x$, SiON, $Al_2O_3$, $TiO_2$, $Ta_2O_5$, hafnium oxide ($HfO_2$), or ZnO.

The second gate insulating layer 215 may cover the gate electrode GE. Similar to the first gate insulating layer 213, the second gate insulating layer 215 may include an inorganic insulating material, such as $SiO_2$, $SiN_x$, SiON, $Al_2O_3$, $TiO_2$, $Ta_2O_5$, $HfO_2$, or ZnO.

An upper electrode CE2 of the storage capacitor Cst may be arranged on the second gate insulating layer 215. The upper electrode CE2 may overlap the gate electrode GE therebelow. In this case, the gate electrode GE and the upper electrode CE2 overlapping each other with the second gate insulating layer 215 therebetween in a plan view may constitute the storage capacitor Cst. In other words, the gate electrode GE may function as a lower electrode CE1 of the storage capacitor Cst.

As described above, the storage capacitor Cst and the thin-film transistor TFT may overlap each other. In some embodiments, the storage capacitor Cst and the thin-film transistor TFT may not overlap each other in a plan view.

The upper electrode CE2 may include aluminum (Al), platinum (Pt), palladium (Pd), Ag, magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layer or multi-layer structure including the aforementioned materials.

An interlayer-insulating layer 217 may cover the upper electrode CE2. The interlayer-insulating layer 217 may include $SiO_2$, $SiN_x$, SiON, $Al_2O_3$, $TiO_2$, $Ta_2O_5$, $HfO_2$, or ZnO. The interlayer-insulating layer 217 may have a single layer or multiple layers including the inorganic insulating materials described above.

Each of a drain electrode DE and a source electrode SE may be located on the interlayer-insulating layer 217. Each of the drain electrode DE and the source electrode SE may include a material having good conductivity. Each of the drain electrode DE and the source electrode SE may include a conductive material including Mo, Al, Cu, Ti, etc., and may have multiple layers or a single layer including the above conductive material. In an embodiment, each of the drain electrode DE and the source electrode SE may have a multi-layer structure of a Ti layer, an Al layer, and another Ti layer.

An organic insulating layer 219 may cover the drain electrode DE and the source electrode SE. The organic insulating layer 219 may include an organic insulating material, for example, a general-purpose polymer such as poly(methyl methacrylate) ("PMMA") or polystyrene ("PS")), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any blends thereof. In some embodiments, the organic insulating layer 219 may include a first organic insulating layer and a second organic insulating layer.

The display element layer 220 may be arranged above the pixel circuit layer 210. The display element layer 220 may be arranged above the organic insulating layer 219. The display element layer 220 may include an organic light-emitting diode OLED as a display element, a pixel-defining layer 225, and a spacer 227.

The organic light-emitting diode OLED may be arranged on the organic insulating layer 219. The organic light-emitting diode OLED may emit one of red, green, and blue light, or may emit one of red, green, blue, and white light. The organic light-emitting diode OLED may include a pixel electrode 221, an intermediate layer 222, and an opposite electrode 223.

The pixel electrode 221 may be arranged on the organic insulating layer 219. The pixel electrode 221 may be electrically connected to the source electrode SE or the drain electrode DE through a contact hole defined in the organic insulating layer 219. The pixel electrode 221 may include a conductive oxide such as indium tin oxide (ITO), indium zinc oxide (IZO), zinc oxide (ZnO), indium oxide ($In_2O_3$), indium gallium oxide ("IGO"), or aluminum zinc oxide ("AZO"). In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chrome (Cr), or any compounds thereof. In another embodiment, the pixel electrode 221 may further include a layer including ITO, IZO, ZnO, or $In_2O_3$ above/below the aforedescribed reflective film. For example, the pixel electrode 221 may have a multi-layer structure of an ITO layer, an Ag layer, and another ITO layer.

The pixel-defining layer 225 defining an opening 2250P exposing a central portion of the pixel electrode 221 may be arranged on the pixel electrode 221. The pixel-defining layer 225 may cover an edge of the pixel electrode 221. The pixel-defining layer 225 may include an organic insulating material and/or an inorganic insulating material. The opening 2250P may define an emission area EA of light emitted by the organic light-emitting diode OLED. For example, a width of the opening 2250P may correspond to a width of the emission area EA.

The spacer 227 may be arranged above the pixel-defining layer 225. The spacer 227 may include an organic insulating material, such as polyimide. In some embodiments, the spacer 227 may include an inorganic insulating material such as $SiN_x$ or $SiO_2$, or may include an organic insulating material and an inorganic insulating material.

In an embodiment, the spacer 227 may include a material different from a material of the pixel-defining layer 225. In another embodiment, the spacer 227 may include the same material as the pixel-defining layer 225, and in this case, the pixel-defining layer 225 and the spacer 227 may be formed together in a mask process using a half tone mask, etc.

The intermediate layer 222 may be arranged above the pixel-defining layer 225. The intermediate layer 222 may include an emission layer 222b in the opening 2250P of the pixel-defining layer 225. The emission layer 222b may include a polymer or a low-molecular weight organic material that emits light of a color.

A first functional layer 222a and a second functional layer 222c may be arranged below and above the emission layer 222b, respectively. For example, the first functional layer 222a may include a hole transport layer ("HTL"), or may include the HTL and a hole injection layer ("HIL"). The second functional layer 222c is an element above the emission layer 222b, and may be omitted. The second functional layer 222c may include an electron transport layer ("ETL") and/or an electron injection layer ("EIL"). Similar to an opposite electrode 223 to be described below, the first functional layer 222a and/or the second functional layer 222c may be common layers formed to entirely cover the substrate 100.

The opposite electrode 223 may include a conductive material having a low work function. For example, the opposite electrode 223 may include a (semi)transparent layer including Ag, Mg, Al, Pt, Pd, Au, Ni, Nd, Ir, Cr, Li, Ca, or any alloys thereof. In some embodiments, the opposite electrode 223 may further include a layer including ITO, IZO, ZnO or $In_2O_3$, above the (semi)transparent layer including the aforedescribed material.

In some embodiments, a capping layer (not shown) may be further arranged above the opposite electrode 223. The capping layer may include lithium fluoride (LiF), an inorganic material, and/or an organic material.

The encapsulation layer 300 may be arranged above the display layer 200. The encapsulation layer 300 may cover the organic light-emitting diode OLED. In an embodiment, the encapsulation layer 300 may include at least one inorganic encapsulation layer and at least one organic encapsulation layer. In FIG. 7, the encapsulation layer 300 includes a first inorganic encapsulation layer 310, an organic encapsulation layer 320, and a second inorganic encapsulation layer 330 that are sequentially stacked.

Each of the first inorganic encapsulation layer 310 and the second inorganic encapsulation layer 330 may include one or more inorganic materials from among $Al_2O_3$, $TiO_2$, $Ta_2O_5$, $HfO_2$, ZnO, $SiO_2$, and SiON. The organic encapsulation layer 320 may include a polymer-based material. The polymer-based material may include an acryl-based resin, an epoxy-based resin, polyimide, polyethylene, or the like. In an embodiment, the organic encapsulation layer 320 may include acrylate.

The functional layer 400 may be arranged above the encapsulation layer 300. The functional layer 400 may include a touch buffer layer 401, a first touch insulating layer 403, a second touch insulating layer 405, an organic layer 407, an inorganic layer 409, a planarization layer 411, a first touch conductive layer CTL1, a second touch conductive layer CTL2, a lower light-shielding layer LLBL, and an upper light-shielding layer ULBL.

The touch buffer layer 401 may be arranged above the encapsulation layer 300. In an embodiment, the touch buffer layer 401 may be formed directly above the encapsulation layer 300. The touch buffer layer 401 may prevent damage to the encapsulation layer 300 and block an interference signal that may occur when the functional layer 400 is driven as a touch sensor layer. The touch buffer layer 401 includes an inorganic insulating material such as $SiO_2$, $SiN_x$, and SiON, and may have a single layer or multiple layers. In some embodiments, the touch buffer layer 401 may be omitted.

The first touch conductive layer CTL1 may be arranged above the touch buffer layer 401. The first touch insulating layer 403 may cover the first touch conductive layer CTL1 and may define a contact hole 403H exposing at least part of the first touch conductive layer CTL1 in a plan view. The second touch conductive layer CTL2 may be arranged above the first touch insulating layer 403. The second touch conductive layer CTL2 may be electrically connected to the first touch conductive layer CTL1 through a contact hole 403H defined in the first touch insulating layer 403. As shown in FIG. 7, each of the first sensing electrode SP1 and the second sensing electrode SP2 described with reference to FIG. 6 may have a two-layer structure of the first touch conductive layer CTL1 and the second touch conductive layer CTL2 that are electrically connected to each other through the contact hole 403H of the first touch insulating layer 403.

At least one of the first touch conductive layer CTL1 and the second touch conductive layer CTL2 may define a conductive layer hole overlapping the emission area EA of the organic light-emitting diode OLED in a plan view. In an embodiment, the first touch conductive layer CTL1 may define a first conductive layer hole CTLH1 overlapping the emission area EA. In an embodiment, the second touch conductive layer CTL2 may define a second conductive layer hole CTLH2 overlapping the emission area EA in a plan view.

The first touch insulating layer 403 may include an inorganic material or an organic material. The inorganic material may be at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may be at least one of an acryl-based resin, a methacryl-based resin, polyisoprene, a vinyl-based resin, an epoxy-based resin, a urethane-based resin, a cellulose-based resin, and a perylene-based resin.

At least one of the first touch conductive layer CTL1 and the second touch conductive layer CTL2 may include a metal layer or a transparent conductive layer, and the metal layer may include Mo, Ag, Ti, Cu, Al, or any alloys thereof. The transparent conductive layer may include a transparent conductive oxide, such as ITO, IZO, ZnO, ITZO, or the like. In addition, the transparent conductive layer may include a conductive polymer such as PEDOT, a metal nanowire, a carbon nanotube, graphene, or the like. In an embodiment, each of the first touch conductive layer CTL1 and the second touch conductive layer CTL2 may have a three-layer structure of a Ti layer, an Al layer, and a Ti layer.

The lower light-shielding layer LLBL may be arranged above the encapsulation layer 300. In an embodiment, the lower light-shielding layer LLBL may cover at least one of the first touch conductive layer CTL1 and the second touch conductive layer CTL2. For example, the lower light-shielding layer LLBL may cover the second touch conductive layer CTL2. In another example, the lower light-shielding layer LLBL may cover the first touch conductive layer CTL1. In another example, the lower light-shielding layer LLBL may cover both the first touch conductive layer CTL1 and the second touch conductive layer CTL2.

The lower light-shielding layer LLBL may be arranged above the pixel-defining layer 225. The lower light-shielding layer LLBL may be spaced apart from the emission area EA. Thus, light may be emitted to the outside from the organic light-emitting diode OLED.

The lower light-shielding layer LLBL may include a black pigment. The lower light-shielding layer LLBL may at least partially absorb external light or internal reflected light. The lower light-shielding layer LLBL may include a black matrix.

In an embodiment, a color filter may be further arranged on the first touch insulating layer 403. The color filter may overlap the emission area EA in a plan view. In this case, the lower light-shielding layer LLBL and the color filter may function as the anti-reflection layer 500 (see FIG. 2B).

The second touch insulating layer 405 may be arranged above the first touch insulating layer 403. In an embodiment, the second touch insulating layer 405 may cover the second touch conductive layer CTL2. In an embodiment, the second touch insulating layer 405 may cover the lower light-shielding layer LLBL. In this case, the second touch insulating layer 405 may be arranged between the lower light-shielding layer LLBL and the organic layer 407. The second touch insulating layer 405 may cover and protect the first touch conductive layer CTL1 and the second touch conductive layer CTL2.

In an embodiment, the second touch insulating layer 405 may include a photoresist. In this case, the second touch insulating layer 405 may be formed by applying the photoresist onto the entire encapsulation layer 300 and exposing and developing the photoresist. In an embodiment, the second touch insulating layer 405 may include a flat upper surface. In another embodiment, the second touch insulating layer 405 may define an opening overlapping the emission area EA in a plan view.

In an embodiment, the second touch insulating layer 405 may include an acryl-based resin (e.g., poly(methyl methacrylate, polyacrylic acid, etc.), ethylhexyl acrylate, pentafluoropropyl acrylate, poly(ethylene glycol) dimethacrylate, or ethylene glycol dimethacrylate. In some embodiments, the second touch insulating layer 405 may further include a thermal curing agent such as epoxy and/or a photocuring agent.

The organic layer 407 may be arranged above the second touch insulating layer 405. The organic layer 407 may be arranged above the lower light-shielding layer LLBL. In an embodiment, when the second touch insulating layer 405 defines an opening overlapping the emission area EA in a plan view, the organic layer 407 may fill the opening of the second touch insulating layer 405.

In an embodiment, a thickness 407d of the organic layer 407 may be greater than a thickness 405d of the second touch insulating layer 405. In an embodiment, the thickness 407d of the organic layer 407 in a thickness direction (i.e., z direction) may be greater than a thickness 320d of the organic encapsulation layer 320. The thickness 407d of the organic layer 407 may correspond to a distance between an upper surface of the organic layer 407 and a lower surface of the organic layer 407 in a third direction (for example, a z direction or a -z direction). The thickness 405d of the second touch insulating layer 405 may correspond to a distance between an upper surface of the second touch insulating layer 405 and a lower surface of the second touch insulating layer 405 in the third direction (for example, the z direction or the -z direction). The thickness 320d of the organic encapsulation layer 320 may correspond to a distance between an upper surface of the first inorganic encapsulation layer 310 and an upper surface of the organic encapsulation layer 320 in the third direction (for example, the z direction or the -z direction). In an embodiment, the thickness 407d of the organic layer 407 may be about 20 micrometers (μm) or more.

In an embodiment, the organic layer 407 may include an acryl-based organic material and a siloxane-based organic material. In an embodiment, the organic layer 407 may include polydiarylsiloxane, methyltrimethoxysilane, or tetramethoxysilane. In an embodiment, the organic layer 407 may be formed by applying the organic material by inkjet printing and then curing the organic material. In another embodiment, the organic layer 407 may be formed by an evaporation process.

In an embodiment, a metal oxide particle such as ZnO, $TiO_2$, zirconium oxide ($ZrO_2$), and barium titanate ($BaTiO_3$) may be dispersed in the organic layer 407. In an embodiment, the organic layer 407 may be formed by applying an organic material using inkjet, the organic material including a metal oxide particle. In an embodiment, a refractive index of the organic layer 407 may be greater than a refractive index of the second touch insulating layer 405.

The inorganic layer 409 may be arranged above the organic layer 407. A thickness 409d of the inorganic layer 409 may be less than the thickness 407d of the organic layer 407 in the third direction (i.e., z direction). The thickness 409d of the inorganic layer 409 may correspond to a distance between an upper surface of the inorganic layer 409 and a lower surface of the inorganic layer 409 in the third direction (for example, the z direction or the -z direction). In an embodiment, the thickness 409d of the inorganic layer 409 may be about 0.05 μm to about 0.5 μm. The inorganic layer 409 may include an inorganic insulating material, such as $SiO_2$, $SiN_x$, SiON, $Al_2O_3$, $TiO_2$, $Ta_2O_5$, $HfO_2$, or ZnO. When the upper light-shielding layer ULBL is formed above the inorganic layer 409, the inorganic layer 409 may prevent or reduce damage to the organic layer 407 arranged below the inorganic layer 409.

The upper light-shielding layer ULBL may be arranged above the inorganic layer 409. The upper light-shielding layer ULBL may be arranged above the pixel-defining layer 225. The upper light-shielding layer ULBL may be spaced apart from the emission area EA. Thus, light may be emitted to the outside from the organic light-emitting diode OLED.

In an embodiment, the upper light-shielding layer ULBL may overlap the lower light-shielding layer LLBL in a plan view. For example, the upper light-shielding layer ULBL may at least partially overlap the lower light-shielding layer LLBL. The upper light-shielding layer ULBL may be arranged above the lower light-shielding layer LLBL. In an embodiment, the upper light-shielding layer ULBL may be spaced apart from the lower light-shielding layer LLBL. In an embodiment, the upper light-shielding layer ULBL may be spaced apart from the lower light-shielding layer LLBL by the organic layer 407.

Similar to the lower light-shielding layer LLBL, the upper light-shielding layer ULBL may include a black pigment. The upper light-shielding layer ULBL may at least partially absorb external light or internal reflected light. The upper light-shielding layer ULBL may include a black matrix.

The planarization layer 411 may be arranged above the inorganic layer 409 and the upper light-shielding layer ULBL. The planarization layer 411 may cover the upper light-shielding layer ULBL. An upper surface of the planarization layer 411 may be approximately flat and may include an organic material, such as acryl, benzocyclobutene ("BCB") or hexamethyldisiloxane ("HMDSO").

The lower light-shielding layer LLBL and the upper light-shielding layer ULBL may reduce the progress of light emitted by the organic light-emitting diode OLED in a direction oblique to a front surface of the display panel 10.

Referring to FIG. 8, light emitted by the organic light-emitting diode OLED may be emitted in the third direction (for example, the z direction or the -z direction) that is perpendicular to a front surface of the substrate 100. In addition, the light emitted by the organic light-emitting diode OLED may be emitted in a direction oblique to the front surface of the substrate 100 for various reasons. For example, the light emitted by the organic light-emitting diode OLED may progress in a direction oblique to the front surface of the substrate 100 due to refraction and/or reflection. Here, the oblique direction may be a direction of which an angle with respect to the third direction (for example, the z direction or the -z direction) is more than 0 degree and less than 90 degrees. In this case, the light emitted by the organic light-emitting diode OLED may reach not only a user using the display device but also another person around the user. Thus, information provided by the display device may be shared with the other person.

At least one of the lower light-shielding layer LLBL and the upper light-shielding layer ULBL may reduce the emission of the light emitted by the organic light-emitting diode OLED in a direction oblique to the front surface of the substrate 100 and/or the display panel 10. For example, at least one of the lower light-shielding layer LLBL and the upper light-shielding layer ULBL may at least partially absorb light progressing in a direction oblique to the front surface of the substrate 100 from among the light emitted by the organic light-emitting diode OLED.

In an embodiment, the thickness 407d of the organic layer 407 may be greater than the thickness 405d of the second touch insulating layer 405 or the thickness 320d of the organic encapsulation layer 320. Thus, the upper light-shielding layer ULBL may be farther apart from the organic light-emitting diode OLED. In this case, the upper light-shielding layer ULBL may reduce the emission of the light emitted by the organic light-emitting diode OLED in a direction oblique to the front surface of the substrate 100 or the display panel 10. Thus, light progressing in a direction oblique with respect to the third direction (for example, the z direction or the −z direction) from among the light emitted by the organic light-emitting diode OLED may be at least partially removed, and light emitted from the display panel 10 may progress substantially in the third direction (for example, the z direction or the −z direction).

The organic layer 407 may separate the lower light-shielding layer LLBL and the upper light-shielding layer ULBL from each other. In an embodiment, primarily, the lower light-shielding layer LLBL may at least partially absorb the light progressing in the direction oblique with respect to the third direction (for example, the z direction or the −z direction). In addition, secondarily, the upper light-shielding layer ULBL may absorb the light progressing in the direction oblique with respect to the third direction (for example, the z direction or the −z direction). Thus, the light emitted from the display panel 10 may progress substantially in the third direction (for example, the z direction or the −z direction).

Figure 9A:
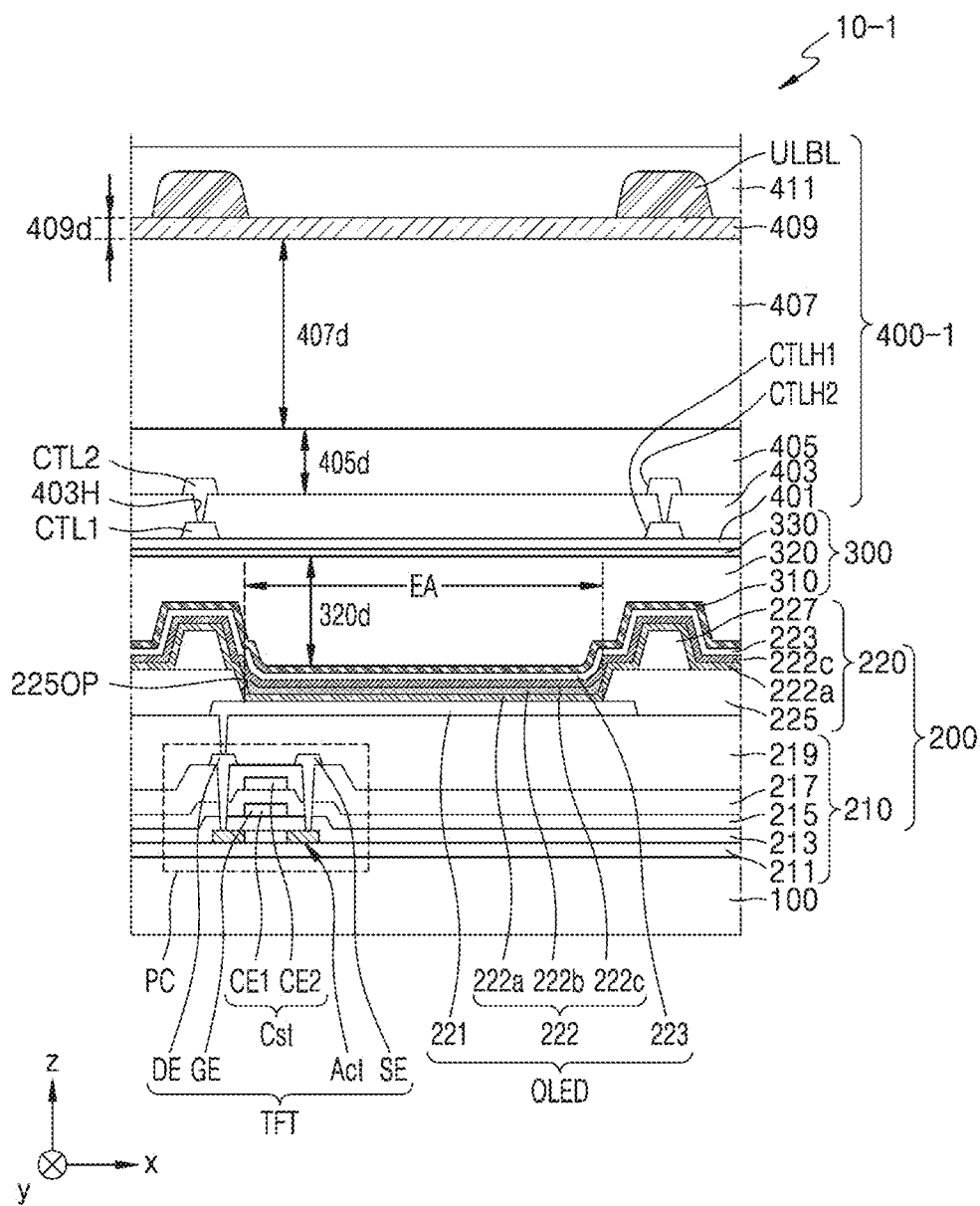
FIG. 9A is a cross-sectional view schematically illustrating a display panel according to another embodiment.

FIG. 9A is a cross-sectional view schematically illustrating a display panel 10-1 according to another embodiment. In FIG. 9A, the same reference numerals as those of FIG. 7 denote the same elements, and redundant descriptions thereof will be omitted. An embodiment described with reference to FIG. 9A is different from the embodiment described with reference to FIG. 7 in that the lower light-shielding layer LLBL is omitted.

Referring to FIG. 9A, the display panel 10-1 may include a substrate 100, a display layer 200, an encapsulation layer 300, and a functional layer 400-1. The display layer 200 may include a pixel circuit layer 210 and a display element layer 220.

The functional layer 400-1 may be arranged above the encapsulation layer 300. The functional layer 400-1 may include a touch buffer layer 401, a first touch insulating layer 403, a second touch insulating layer 405, an organic layer 407, an inorganic layer 409, a planarization layer 411, a first touch conductive layer CTL1, a second touch conductive layer CTL2, and an upper light-shielding layer ULBL.

The second touch insulating layer 405 may be arranged above the first touch insulating layer 403. In an embodiment, the second touch insulating layer 405 may cover the second touch conductive layer CTL2. In this case, the second touch insulating layer 405 may be arranged between the first touch insulating layer 403 and the organic layer 407.

The upper light-shielding layer ULBL may be arranged above the inorganic layer 409. The upper light-shielding layer ULBL may be arranged above a pixel-defining layer 225. The upper light-shielding layer ULBL may be spaced apart from an emission area EA. Thus, light may be emitted to the outside from an organic light-emitting diode OLED. The upper light-shielding layer ULBL may reduce the progress of the light emitted by the organic light-emitting diode OLED in a direction oblique to a front surface of the substrate 100 and/or the display panel 10-1.

Figure 9B:
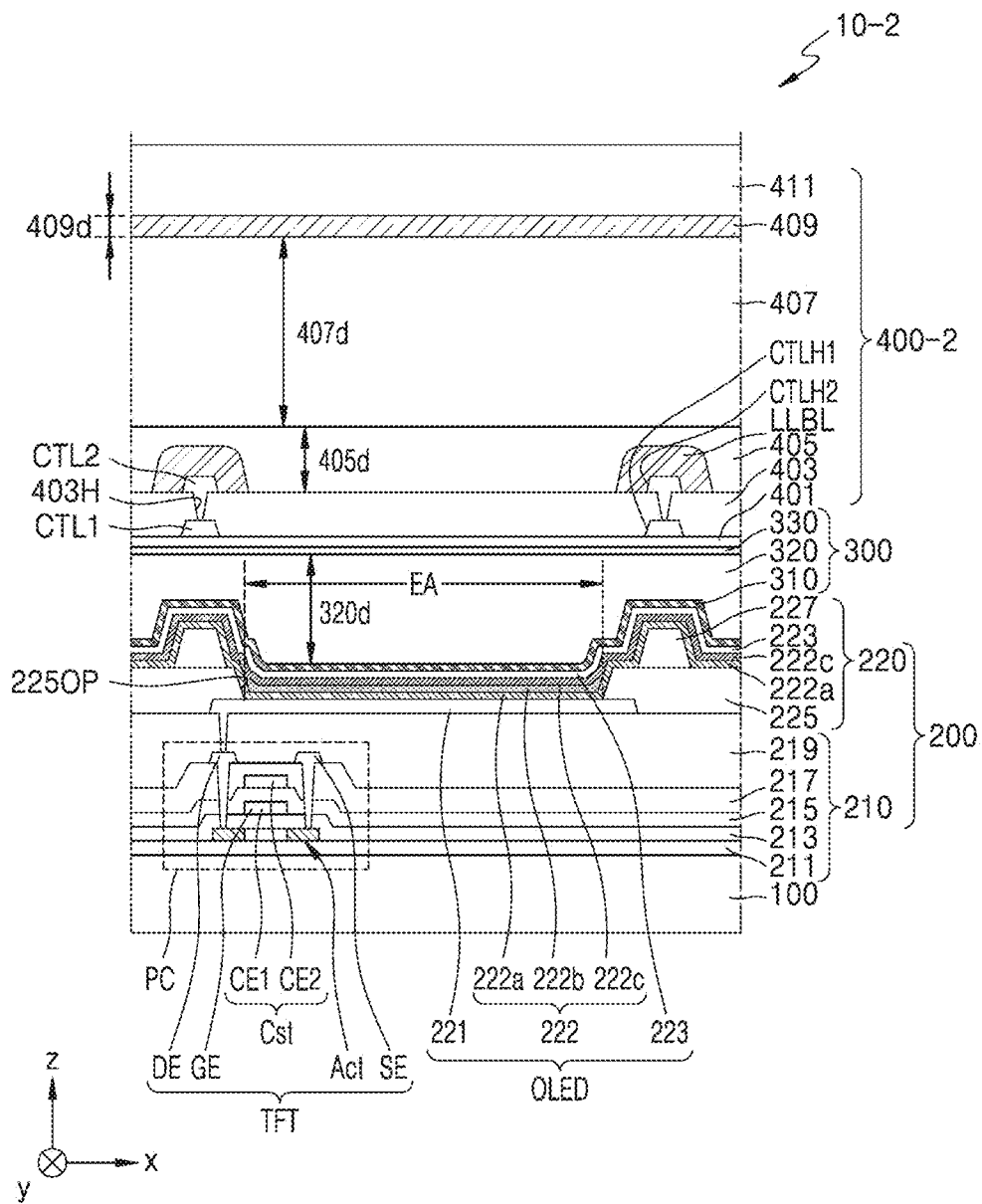
FIG. 9B is a cross-sectional view schematically illustrating a display panel according to still another embodiment.

FIG. 9B is a cross-sectional view schematically illustrating a display panel 10-2 according to another embodiment. In FIG. 9B, the same reference numerals as those of FIG. 7 denote the same elements, and redundant descriptions thereof will be omitted. An embodiment described with reference to FIG. 9B is different from the embodiment described with reference to FIG. 7 in that the upper light-shielding layer ULBL is omitted.

Referring to FIG. 9B, the display panel 10-2 may include a substrate 100, a display layer 200, an encapsulation layer 300, and a functional layer 400-2. The display layer 200 may include a pixel circuit layer 210 and a display element layer 220.

The functional layer 400-2 may be arranged above the encapsulation layer 300. The functional layer 400-2 may include a touch buffer layer 401, a first touch insulating layer 403, a second touch insulating layer 405, an organic layer 407, an inorganic layer 409, a planarization layer 411, a first touch conductive layer CTL1, a second touch conductive layer CTL2, and a lower light-shielding layer LLBL.

The lower light-shielding layer LLBL may be arranged above the encapsulation layer 300. In an embodiment, the lower light-shielding layer LLBL may cover at least one of the first touch conductive layer CTL1 and the second touch conductive layer CTL2. The lower light-shielding layer LLBL may reduce the progress of the light emitted by the organic light-emitting diode OLED in a direction oblique to a front surface of the substrate 100 and/or the display panel 10-2.

The second touch insulating layer 405 may be arranged above the first touch insulating layer 403. In an embodiment, the second touch insulating layer 405 may cover the second touch conductive layer CTL2. In an embodiment, the second touch insulating layer 405 may cover the lower light-shielding layer LLBL.

The organic layer 407 may be arranged above the second touch insulating layer 405. The organic layer 407 may be arranged above the lower light-shielding layer LLBL. In some embodiments, the organic layer 407 may be omitted.

The inorganic layer 409 may be arranged above the organic layer 407. A thickness 409d of the inorganic layer 409 may be less than a thickness 407d of the organic layer 407 in the third direction (i.e., z direction). In some embodiments, the inorganic layer 409 may be omitted.

The planarization layer 411 may be arranged above the inorganic layer 409. The planarization layer 411 may cover the inorganic layer 409.

Figure 10:
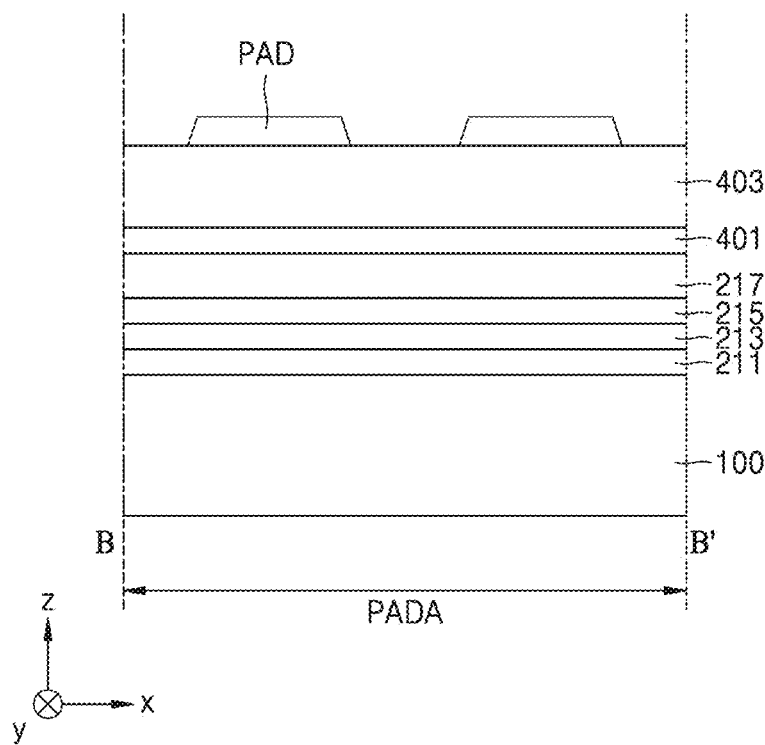
FIG. 10 is a cross-sectional view schematically illustrating a display panel in FIG. 4, taken along line B-B', according to an embodiment.

FIG. 10 is a cross-sectional view schematically illustrating a display panel in FIG. 4, taken along line B-B', according to an embodiment. FIG. 10 is a cross-sectional view schematically illustrating a pad area PADA of a display panel. In FIG. 10, the same reference elements as those of FIG. 7 denote the same elements, and redundant descriptions thereof will be omitted.

Referring to FIG. 10, a pad PAD may be arranged in the pad area PADA. For example, at least one of a buffer layer 211, a first gate insulating layer 213, a second gate insulating layer 215, an interlayer-insulating layer 217, a touch buffer layer 401, and a first touch insulating layer 403 may be arranged above the substrate 100.

The pad PAD may be arranged above the substrate 100. The pad PAD may be exposed by not being covered with an insulating layer in the pad area PADA. The pad PAD may be electrically connected to a printed circuit board and/or a driver IC. A plurality of pads PAD may be provided in the pad area PADA. The plurality of pads PAD may be spaced apart from one another.

In an embodiment, the pad PAD may include a metal layer or a transparent conductive layer, and the metal layer may include Mo, Ag, Ti, Cu, Al, and any alloys thereof. The transparent conductive layer may include a transparent conductive oxide, such as ITO, IZO, ZnO, ITZO, or the like. In addition, the transparent conductive layer may include a conductive polymer such as PEDOT, a metal nanowire, carbon nanotubes, graphene, or the like. In an embodiment, the pad PAD may have a three-layer structure of a Ti layer, an Al layer, and another Ti layer.

In an embodiment, the pad PAD may be formed simultaneously when one of the first touch conductive layer CTL1 and the second touch conductive layer CTL2, which are described with reference to FIG. 7, is formed. In an embodiment, the pad PAD may be formed simultaneously when at least one of the source electrode SE and the drain electrode DE, which are described above with reference to FIG. 7, is formed.

FIGS. 11A to 11H are cross-sectional views illustrating a method of manufacturing a display device, according to an embodiment. In FIGS. 11A to 11H, the same reference numerals as those of FIGS. 7 and 10 denote the same elements, and redundant descriptions thereof will be omitted.

Figure 11A:
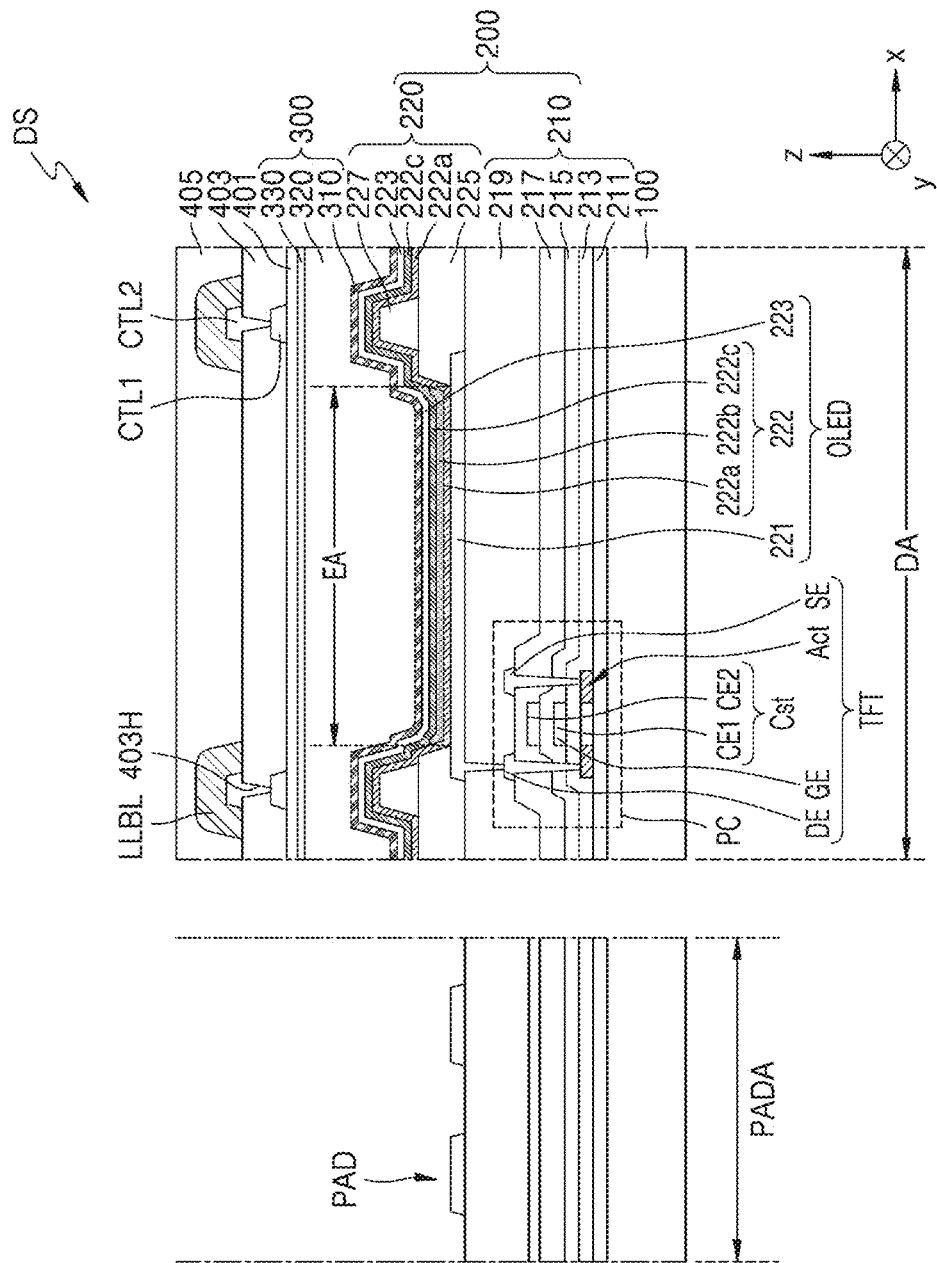
FIGS. 11A to 11H are cross-sectional views illustrating a method of manufacturing a display device, according to an embodiment.

Referring to FIG. 11A, a display substrate DS may be prepared. The display substrate DS may include a display panel and/or a display device being manufactured. The display substrate DS may include a substrate 100, a display layer 200, an encapsulation layer 300, and a pad PAD. The substrate 100 may include a display area DA and a pad area PADA outside the display area DA.

The display layer 200 may be arranged in the display area DA. The display layer 200 may include a pixel circuit layer 210 and a display element layer 220 above the pixel circuit layer 210.

The encapsulation layer 300 may be arranged above the display layer 200. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330.

A touch buffer layer 401, a first touch insulating layer 403, a first touch conductive layer CTL1, and a second touch conductive layer CTL2 may be arranged above the encapsulation layer 300.

A lower light-shielding layer LLBL may be arranged above the encapsulation layer 300. In an embodiment, the lower light-shielding layer LLBL may include at least one of the first touch conductive layer CTL1 and the second touch conductive layer CTL2.

The lower light-shielding layer LLBL may be formed by applying a photoresist layer and exposing and developing the photoresist layer. The lower light-shielding layer LLBL is formed in similar way to a method of forming an upper light-shielding layer to be described later below, and thus, detailed descriptions thereof will be provided regarding the method of forming the upper light-shielding layer. In some embodiments, the lower light-shielding layer LLBL may be omitted.

A second touch insulating layer 405 may be arranged above the first touch insulating layer 403. In an embodiment, the second touch insulating layer 405 may cover the second touch conductive layer CTL2. In an embodiment, the second touch insulating layer 405 may cover the lower light-shielding layer LLBL.

The pad PAD may be arranged in the pad area PADA.

Figure 11B:
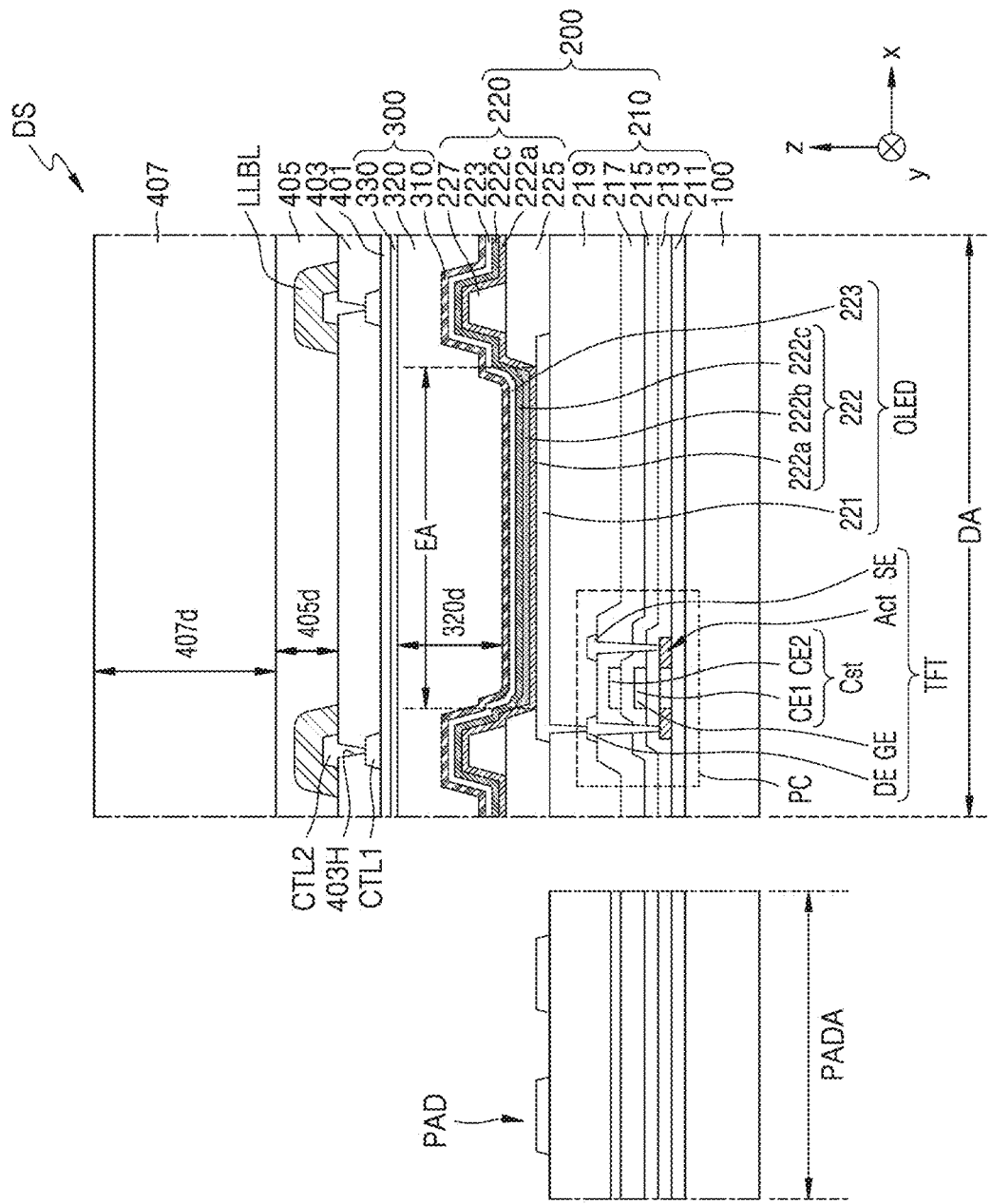

Referring to FIG. 11B, an organic layer 407 may be formed. The organic layer 407 may overlap the display layer 200 in a plan view. In an embodiment, the organic layer 407 may be formed by an inkjet printing process. For example, the organic layer 407 may be formed by discharging ink onto the second touch insulating layer 405, the ink including an organic material. In another embodiment, the organic layer 407 may be formed by an evaporation process.

In an embodiment, a thickness 407d of the organic layer 407 may be greater than a thickness 405d of the second touch insulating layer 405. In an embodiment, the thickness 407d of the organic layer 407 may be greater than a thickness 320d of the organic encapsulation layer 320.

Figure 11C:
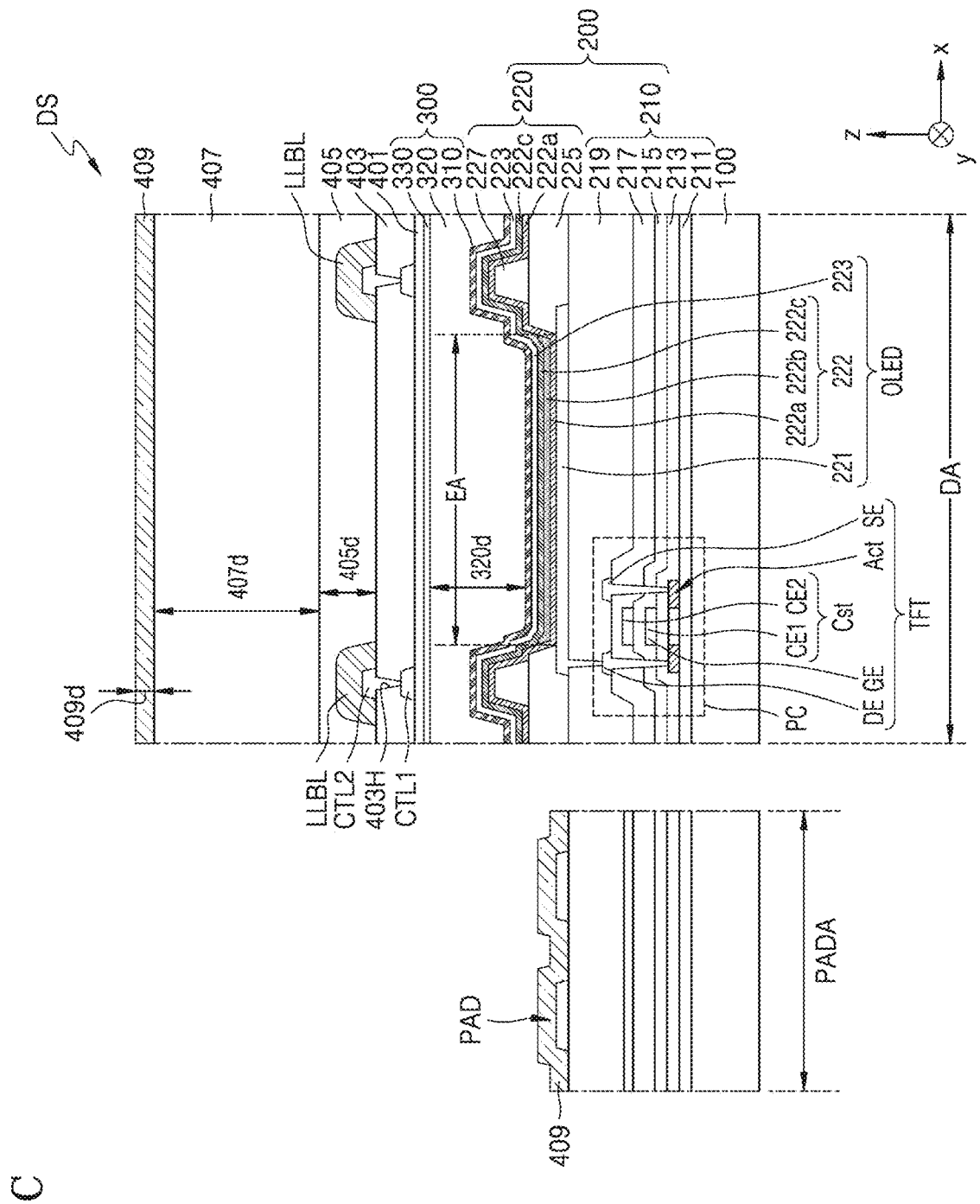

Referring to FIG. 11C, an inorganic layer 409 may be formed on a front surface of the substrate 100. The inorganic layer 409 may be formed above the inorganic layer 409 and the pad PAD. The inorganic layer 409 may cover the pad PAD. A thickness 409d of the inorganic layer 409 may be less than the thickness 407d of the organic layer 407 in the thickness direction.

In an embodiment, the inorganic layer 409 may be formed by chemical vapor deposition ("CVD"). In an embodiment, the inorganic layer 409 may be formed by physical vapor deposition. In an embodiment, the inorganic layer 409 may be formed by atomic layer deposition.

Figure 11D:
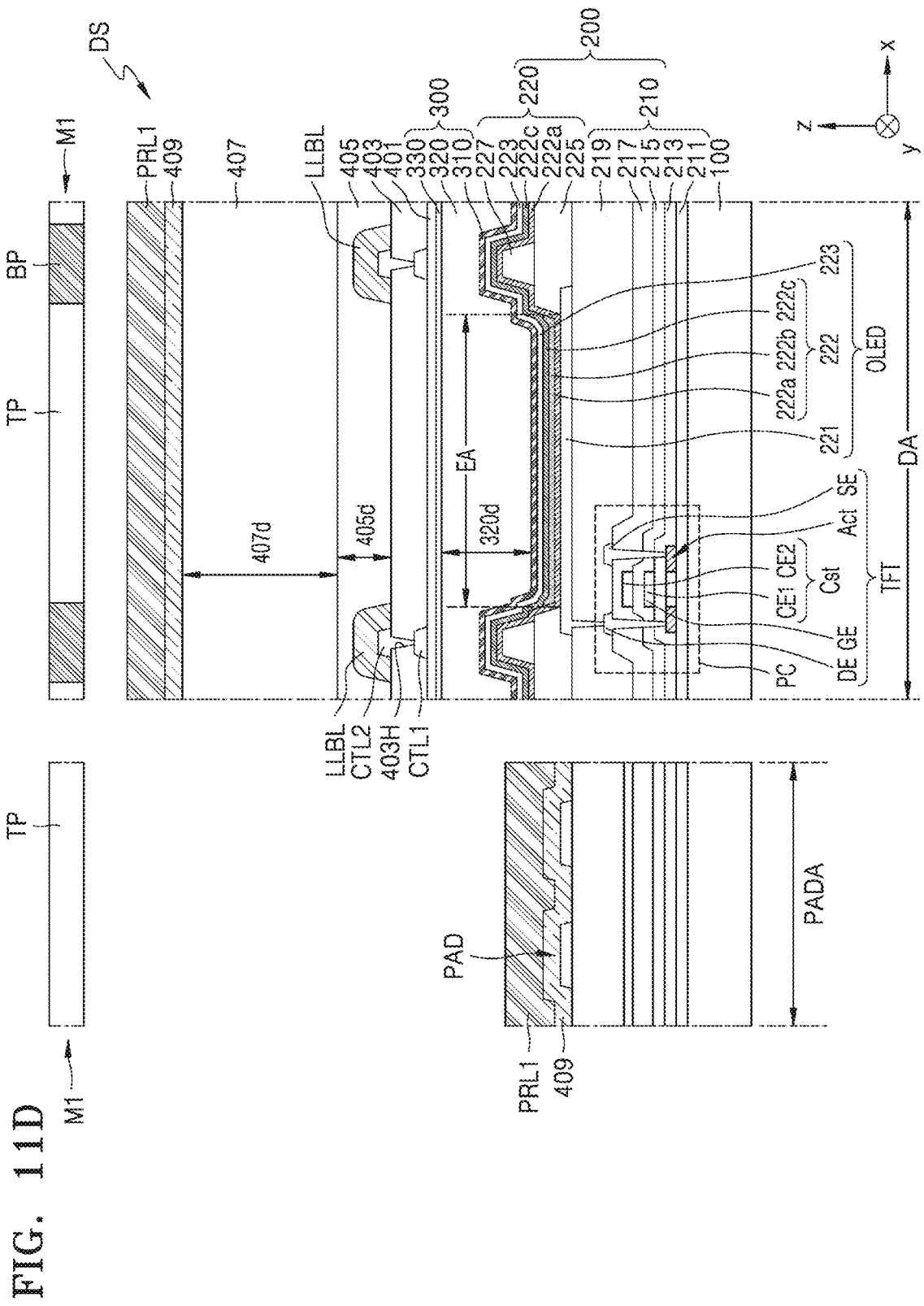

Referring to FIG. 11D, a first photoresist layer PRL1 may be formed above the inorganic layer 409. The first photoresist layer PRL1 may be selected as either a positive type or a negative type and formed above the inorganic layer 409. In the positive-type photoresist layer, an area exposed to light is etched in a subsequent developing process, whereas, in the negative-type photoresist layer, a remaining area excluding the light-exposed area is etched. A case where the first photoresist layer PRL1 is a positive-type photoresist layer will be mainly described in detail below.

The first photoresist layer PRL1 may be formed by applying a photoresist solution (not shown) on the inorganic layer 409 by various methods such as spin-coating, slit-coating, spraying, or immersion.

In addition, before the first photoresist layer PRL1 is applied onto an upper surface of the inorganic layer 409, a process of polishing the upper surface of the inorganic layer 409 on which the first photoresist layer PRL1 is to be formed may be further performed.

A first mask M1 may be arranged above the first photoresist layer PRL1. The first mask M1 may include a light-transmitting portion TP and a light-shielding portion BP. The light-transmitting portion TP may transmit most of light. The light-transmitting portion TP of the first mask M1 may correspond to an opening of the first mask M1. The light-shielding portion BP may shield most of light. The light-shielding portion BP of the first mask M1 may correspond to a body portion of the first mask M1.

In an embodiment, the light-transmitting portion TP of the first mask M1 may be arranged in the pad area PADA. The light-transmitting portion TP of the first mask M1 and the light-shielding portion BP of the first mask M1 may be arranged in the display area DA.

Then, at least part of the first photoresist layer PRL1 may be exposed to light. An area of the first photoresist layer PRL1 overlapping the light-transmitting portion TP of the first mask M1 in a plan view may be exposed to light.

Then, the part of the first photoresist layer PRL1 may be removed. The part of the first photoresist layer PRL1 may be removed by a developing process. The positive-type photoresist solution is used in the first photoresist layer PRL1, and thus, when the first photoresist layer PRL1 goes through the developing process, the area of the first photoresist layer PRL1 exposed to light may be removed. In an embodiment, the area of the first photoresist layer PRL1 overlapping the light-transmitting portion TP of the first mask M1 in a plan view may be removed. In an embodiment, the first photoresist layer PRL1 arranged in the pad area PADA may be removed.

Then, the first photoresist layer PRL1 remaining on the display substrate DS may be cured.

Figure 11E:
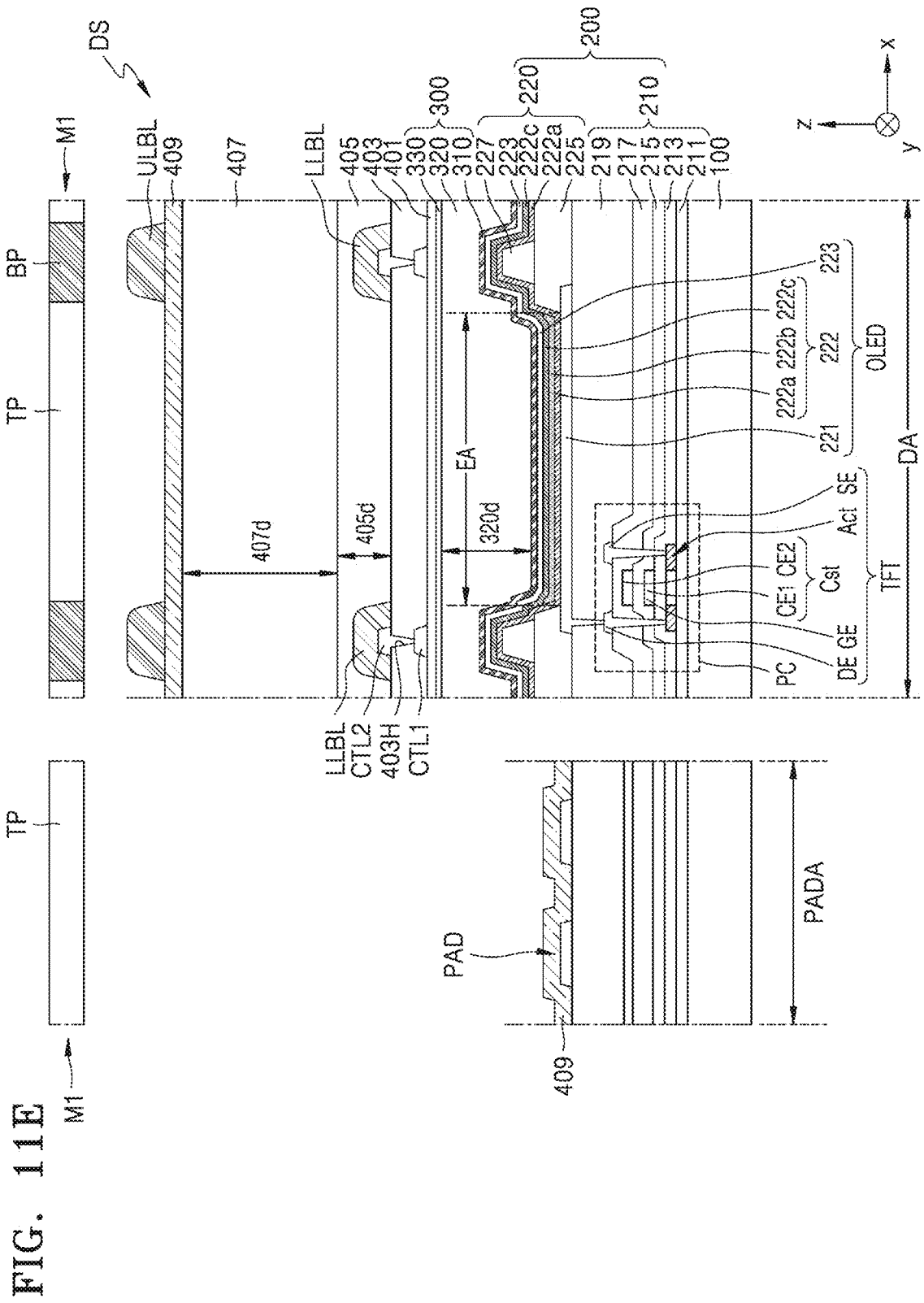

Referring to FIG. 11E, an upper light-shielding layer ULBL may be formed above the inorganic layer 409. In an embodiment, the upper light-shielding layer ULBL may overlap the lower light-shielding layer LLBL in a plan view. For example, the upper light-shielding layer ULBL may at least partially overlap the lower light-shielding layer LLBL. The upper light-shielding layer ULBL may be arranged above the lower light-shielding layer LLBL. In an embodiment, the upper light-shielding layer ULBL may be spaced apart from the lower light-shielding layer LLBL. The upper light-shielding layer ULBL may be spaced apart from the lower light-shielding layer LLBL. In other words, the upper light-shielding layer ULBL may be spaced apart from the lower light-shielding layer LLBL by the organic layer 407.

The inorganic layer 409 in the pad area PADA may be exposed to the outside. The pad PAD arranged in the pad area PADA may be protected by the inorganic layer 409. In other words, by the inorganic layer 409, the pad PAD may be protected from a process in which the first photoresist layer PRL1 is formed, exposed to light, and developed.

Figure 11F:
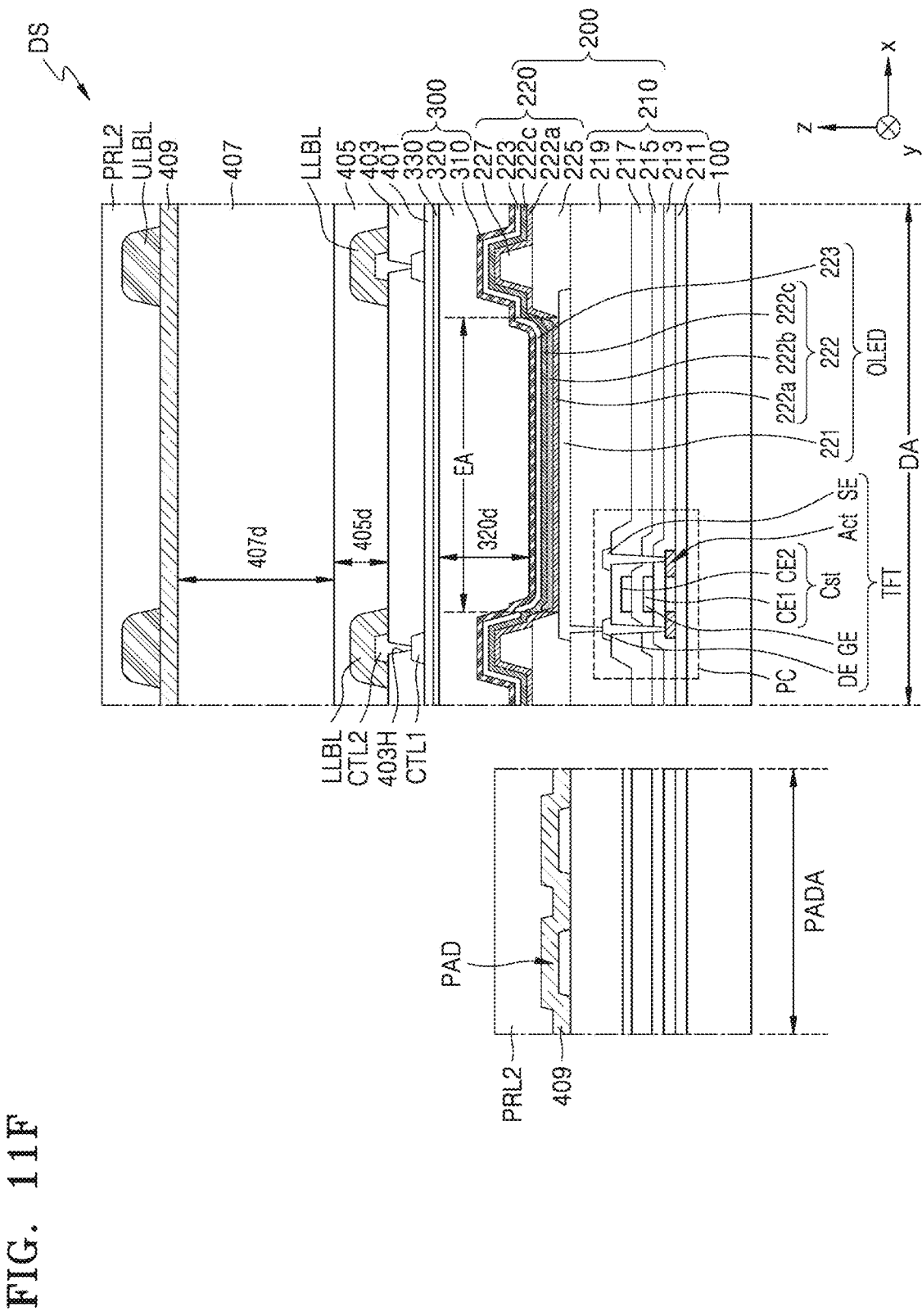

Referring to FIG. 11F, a second photoresist layer PRL2 may be formed above the substrate 100. The second photoresist layer PRL2 may be formed in the display area DA and the pad area PADA. The second photoresist layer PRL2 may be formed above the inorganic layer 409 and the upper light-shielding layer ULBL. The second photoresist layer PRL2 is formed in a similar way to a method of forming the first photoresist layer PRL1, and thus, detailed descriptions thereof will be omitted.

Figure 11G:
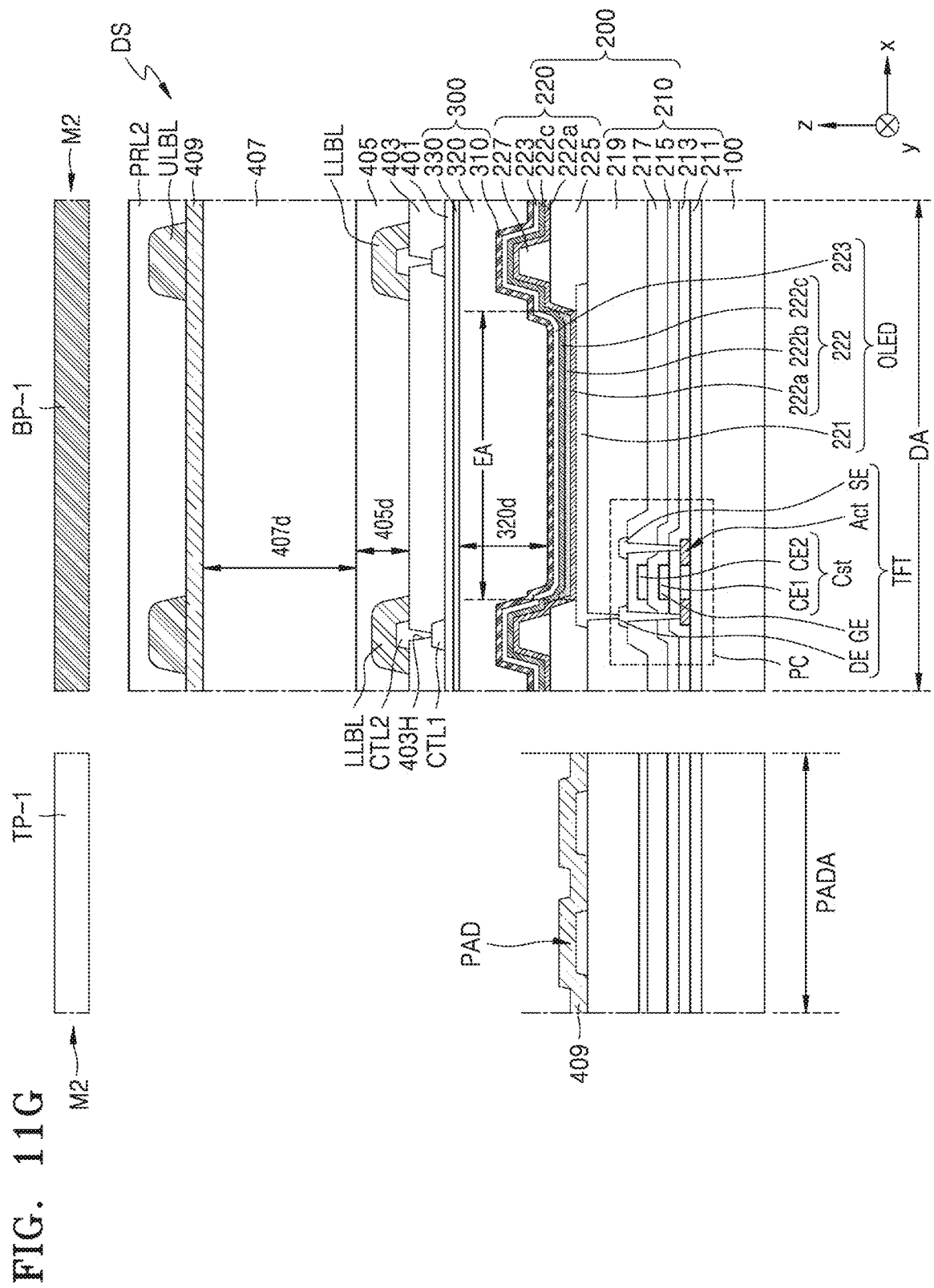

Referring to FIG. 11G, a second mask M2 may be arranged above the second photoresist layer PRL2. The second mask M2 may include a light-transmitting portion TP-1 and a light-shielding portion BP-1. The light-transmitting portion TP-1 may transmit most of light. The light-transmitting portion TP-1 of the second mask M2 may correspond to an opening of the second mask M2. The light-shielding portion BP-1 may shield most of light. The light-shielding portion BP-1 of the second mask M2 may correspond to a body portion of the second mask M2.

In an embodiment, the light-transmitting portion TP-1 of the second mask M2 may be arranged in the pad area PADA. The light-shielding portion BP-1 of the second mask M2 may be arranged in the display area DA.

Then, at least part of the second photoresist layer PRL2 may be exposed to light. An area of the second photoresist layer PRL2 overlapping the light-transmitting portion TP-1 of the second mask M2 in a plan view may be exposed to light. In an embodiment, an area of the second photoresist layer PRL2 overlapping the pad area PADA may be exposed to light.

Then, part of the second photoresist layer PRL2 may be removed. The part of the second photoresist layer PRL2 may be removed by a developing process. In an embodiment, the area of the second photoresist layer PRL2 overlapping the light-transmitting portion TP-1 of the second mask M2 in a plan view may be removed. In an embodiment, the second photoresist layer PRL2 arranged in the pad area PADA may be removed.

Accordingly, a planarization layer 411 may be arranged above the upper light-shielding layer ULBL. The planarization layer 411 may cover the upper light-shielding layer ULBL.

The inorganic layer 409 in the pad area PADA may be exposed to the outside. The pad PAD arranged in the pad area PADA may be protected by the inorganic layer 409. In other words, by the inorganic layer 409, the pad PAD may be protected from a process in which the second photoresist layer PRL2 is formed, exposed to light, and developed.

Figure 11H:
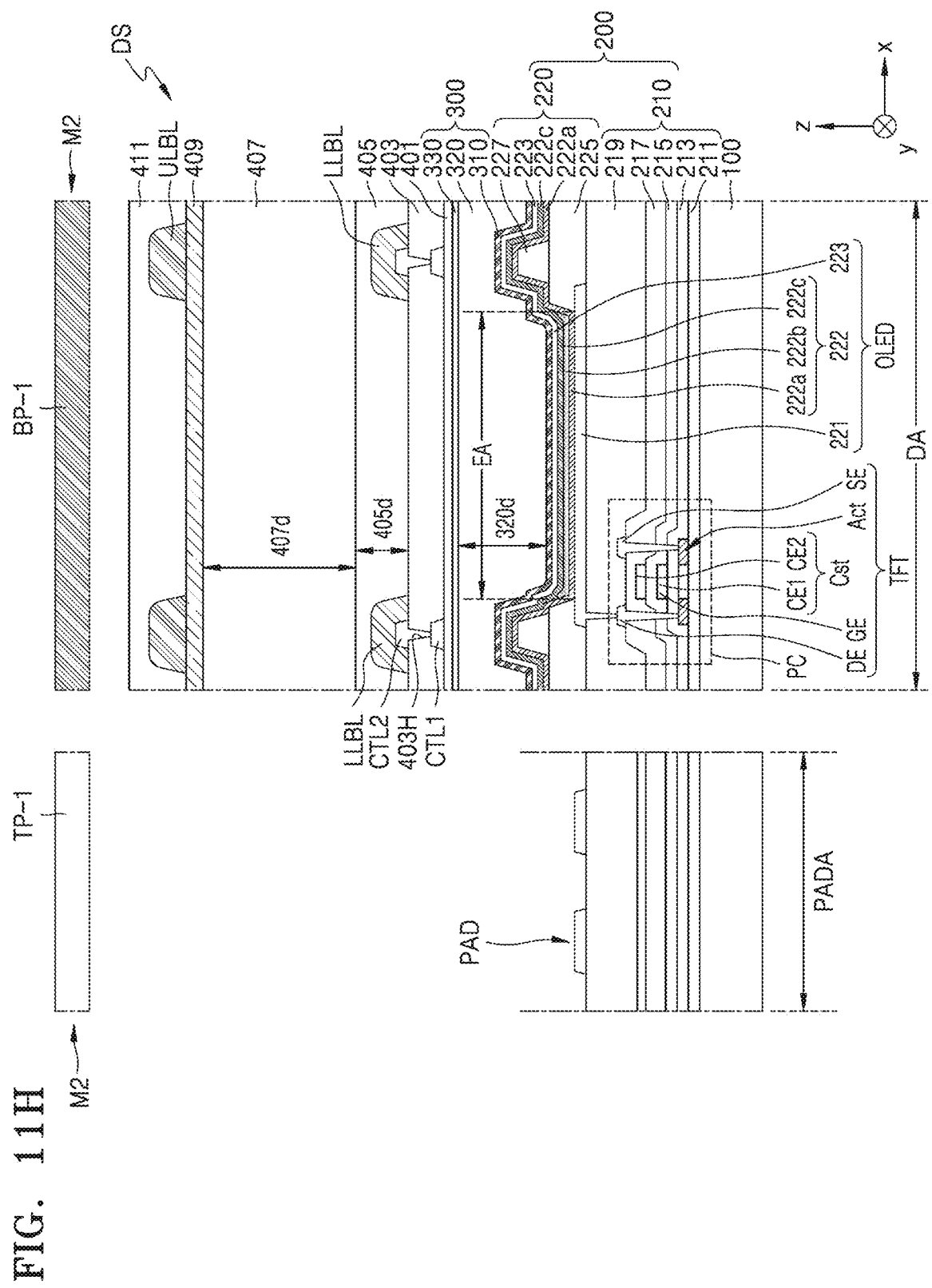

Referring to FIG. 11H, the second mask M2 may be arranged above the inorganic layer 409. The light-transmitting portion TP-1 of the second mask M2 may overlap the pad area PADA in a plan view. The light-shielding portion BP-1 of the second mask M2 may overlap the display area DA.

Then, the inorganic layer 409 arranged in the pad area PADA may be removed. In an embodiment, the inorganic layer 409 may be dry-etched. Thus, the pad PAD arranged in the pad area PADA may be exposed to the outside.

In the present embodiment, the second mask M2 that is used to expose the second photoresist layer PRL2 to light may also be used to perform a dry etching process on the inorganic layer 409 arranged in the pad area PADA. Thus, the efficiency of a method of manufacturing a display device may be improved.

Figure 12:
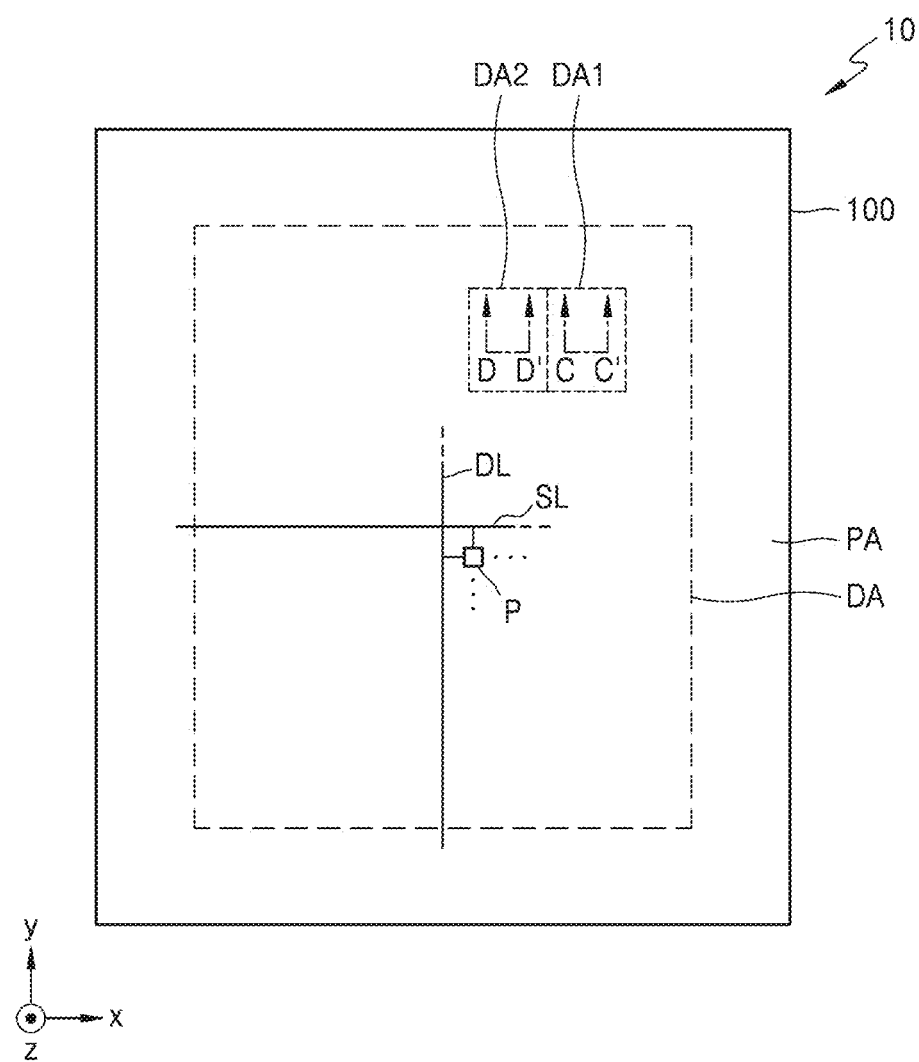
FIG. 12 is a plan view schematically illustrating a display panel according to another embodiment.

FIG. 12 is a plan view schematically illustrating a display panel 10 according to another embodiment. In FIG. 12, the same reference numerals as those of FIG. 4 denote the same elements, and redundant descriptions thereof will be omitted.

Referring to FIG. 12, the display panel 10 may include a substrate 100 and a multi-layer film on the substrate 100. A display area DA and a peripheral area PA may be defined in the substrate 100 and/or the multi-layer film. For example, the substrate 100 may include the display area DA and the peripheral area PA.

A sub-pixel P may be arranged in the display area DA, and a plurality of sub-pixels may display an image. Each of the sub-pixels P may be connected to a scan line SL extending in a first direction (for example, an x direction or a −x direction) and a data line DL extending in a second direction (for example, a y direction or a −y direction).

The display area DA may include a first display area DA1 and a second display area DA2. In an embodiment, the first display area DA1 and the second display area DA2 may be adjacent to each other. The first display area DA1 and the second display area DA2 may be neighboring areas. Although not shown, in some embodiments, a plurality of first display areas DA1 may be provided, and the plurality of first display areas DA1 may surround the second display area DA2. Although not shown, in some embodiments, a plurality of second display areas DA2 may be provided, and the plurality of second display area DA2 may surround the first display area DA1.

The peripheral area PA may be arranged outside the display area DA. The peripheral area PA may at least partially surround the display area DA. In an embodiment, the peripheral area PA may entirely surround the display area DA. A scan driver (not shown) providing a scan signal to each of the sub-pixels P may be arranged in the peripheral area PA. A data driver (not shown) providing a data signal to the sub-pixels P may be arranged in the peripheral area PA. The peripheral area PA may include a pad area (not shown).

Figure 13A:
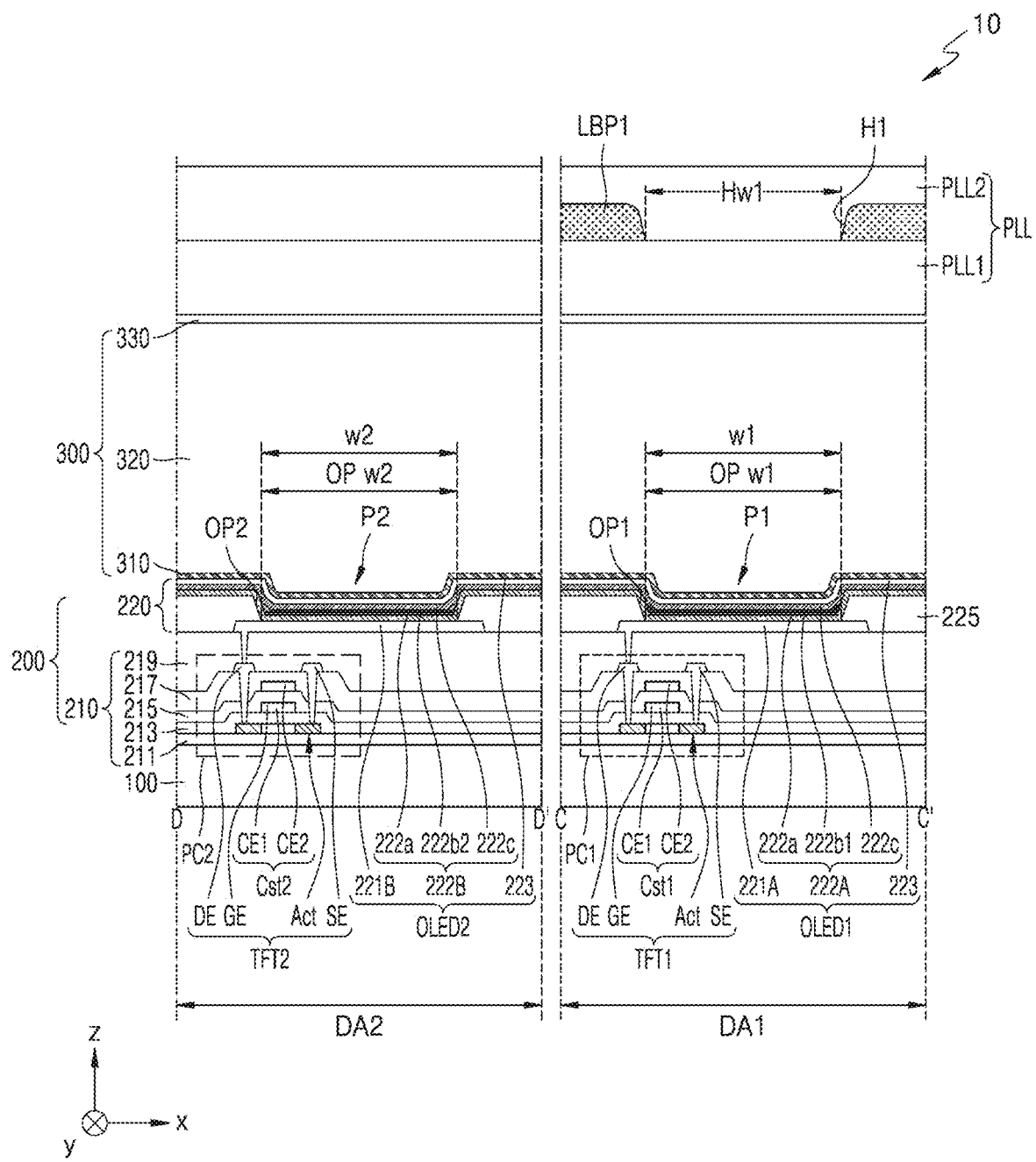
FIGS. 13A and 13B are cross-sectional views of a display panel according to various embodiments.
Figure 13B:
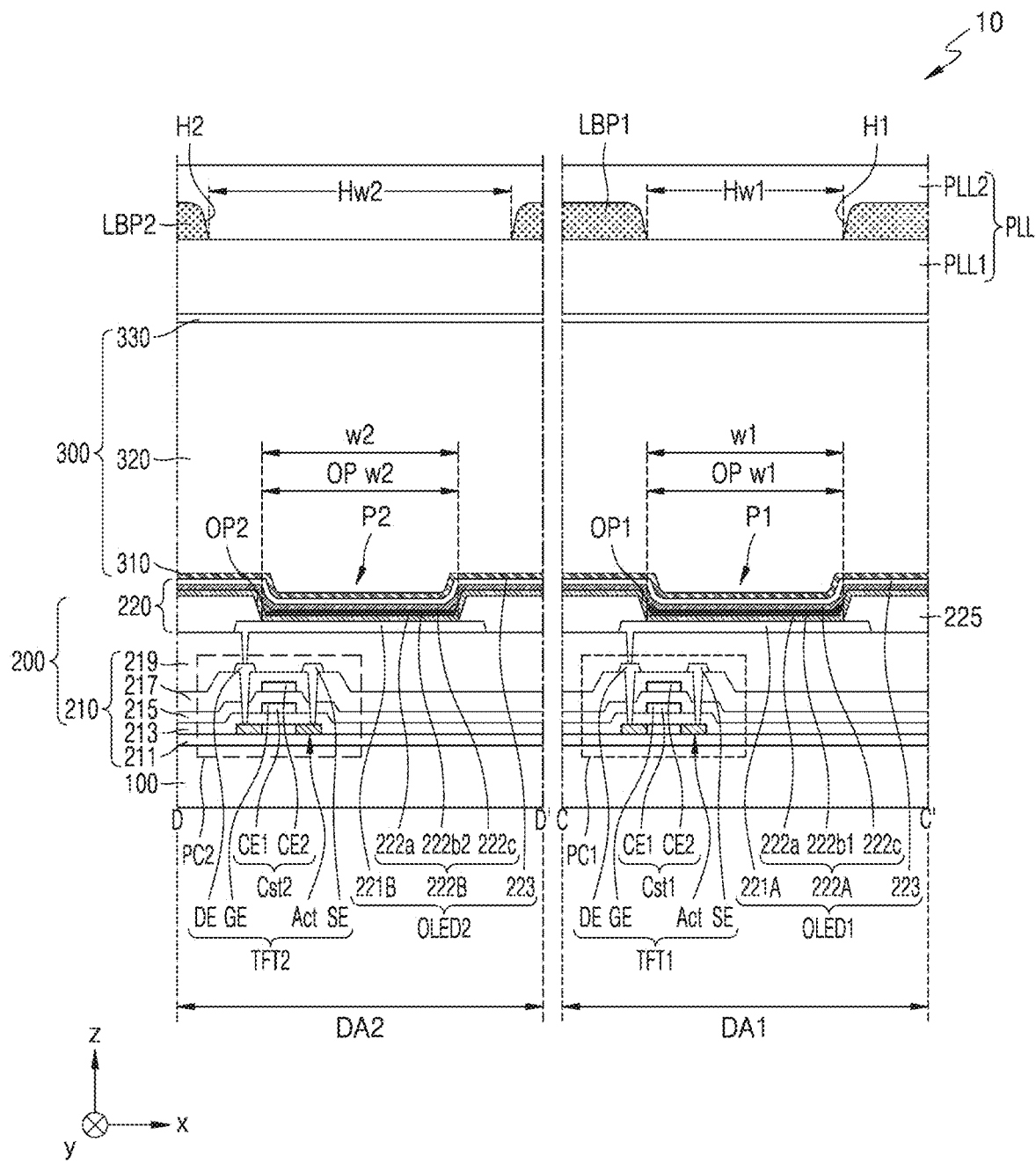

FIGS. 13A and 13B are cross-sectional views of a display panel 10 according to various embodiments. FIGS. 13A and 13B are cross-sectional views of the display panel 10 in FIG. 12, taken along lines C-C' and D-D', respectively. In FIGS. 13A and 13B, the same reference numerals as those of FIG. 7 denote the same elements, and redundant descriptions thereof will be omitted.

Referring to FIGS. 13A and 13B, the display panel 10 may include a substrate 100, a pixel circuit layer 210, a display element layer 220, an encapsulation layer 300, and a first light-shielding pattern LBP1, and a planarization layer PLL.

The pixel circuit layer 210 may be arranged above the substrate 100. The pixel circuit layer 210 may include a buffer layer 211, a first gate insulating layer 213, a second gate insulating layer 215, an interlayer-insulating layer 217, an organic insulating layer 219, a first pixel circuit PC1, and a second pixel circuit PC2. The first pixel circuit PC1 may include a first thin-film transistor TFT1 and a first storage capacitor Cst1. The first thin-film transistor TFT1 may include a semiconductor layer Act, a gate electrode GE, a source electrode SE, and a drain electrode DE. The second pixel circuit PC2 may include a second thin-film transistor TFT2 and a second storage capacitor Cst2. The first pixel circuit PC1 and the second pixel circuit PC2 of FIGS. 13A and 13B are similar to the pixel circuit PC in FIG. 7, and redundant descriptions thereof will be omitted.

The display element layer 220 may be arranged above the pixel circuit layer 210. The display element layer 220 may be arranged above the organic insulating layer 219. The display element layer 220 may include a first organic light-emitting diode OLED1 as a first display element, a second organic light-emitting diode OLED2 as a second display element, and a pixel-defining layer 225.

The first organic light-emitting diode OLED1 and the second organic light-emitting diode OLED2 may be arranged above the organic insulating layer 219. Each of the first organic light-emitting diode OLED1 and the second organic light-emitting diode OLED2 may emit one of red, green, and blue light, or may emit one of red, green, blue, and white light.

The first organic light-emitting diode OLED1 may include a first pixel electrode 221A, a first intermediate layer 222A, and an opposite electrode 223. The first organic light-emitting diode OLED1 may implement a first sub-pixel P1. The second organic light-emitting diode OLED2 may include a second pixel electrode 221B, a second intermediate layer 222B, and the opposite electrode 223. The second organic light-emitting diode OLED2 may implement a second sub-pixel P2.

The first pixel electrode 221A and the second pixel electrode 221B may be arranged above the substrate 100. The first pixel electrode 221A and the second pixel electrode 221B may be arranged above the organic insulating layer 219. The first pixel electrode 221A may overlap a first display area DA1 in a plan view. The second pixel electrode 221B may include a second display area DA2.

The first pixel electrode 221A and the second pixel electrode 221B may be electrically connected to the first thin-film transistor TFT1 and the second thin-film transistor TFT2, respectively, through a contact hole of the organic insulating layer 219. At least one of the first pixel electrode 221A and the second pixel electrode 221B may include a conductive oxide, such as ITO, IZO, ZnO, $In_2O_3$, IGO, or AZO. In another embodiment, at least one of the first pixel electrode 221A and the second pixel electrode 221B may include a reflective film including Ag, Mg, Al, Pt, Pd, Au, Ni, Nd, Ir, Cr, or any compounds thereof. In another embodiment, at least one of the first pixel electrode 221A and the second pixel electrode 221B may further include a film including ITO, IZO, ZnO or $In_2O_3$, above/below the aforementioned reflective film. For example, at least one of the first pixel electrode 221A and the second pixel electrode 221B may have a multi-layer structure of an ITO layer, an Ag layer, and another ITO layer.

The pixel-defining layer 225 may cover an edge of the first pixel electrode 221A and an edge of the second pixel electrode 221B. The pixel-defining layer 225 may define a first opening OP1 and a second opening OP2. The first opening OP1 may expose a central portion of the first pixel electrode 221A. The first opening OP1 may define an emission area of light emitted by the first organic light-emitting diode OLED1. In an embodiment, a size of the first opening OP1 may be a size of the first sub-pixel P1. A width OPw1 of the first opening OP1 may be a width w1 of the first sub-pixel P1. The width OPw1 of the first opening OP1 may be defined as a shortest distance between side surfaces of the pixel-defining layer 225 defining the first opening OP1.

The second opening OP2 may expose a central portion of the second pixel electrode 221B. The second opening OP2 may define an emission area of light emitted by the second organic light-emitting diode OLED2. In an embodiment, a size of the second opening OP2 may be a size of the second sub-pixel P2. A width OPw2 of the second opening OP2 may be a width w2 of the second sub-pixel P2. The width OPw2 of the second opening OP2 may be defined as a shortest distance between side surfaces of the pixel-defining layer 225 defining the second opening OP2.

The first intermediate layer 222A may include a first functional layer 222a, a first emission layer 222b1, and a second functional layer 222c. The second intermediate layer 222B may include the first functional layer 222a, a second emission layer 222b2, and the second functional layer 222c. Each of the first emission layer 222b1 and the second emission layer 222b2 may include a polymer or low-weight molecular organic material that emits light of a color.

In an embodiment, at least one of the first functional layer 222a and the second functional layer 222c may be a common layer that is entirely arranged in a display area. For example, the first functional layer 222a may include a hole transport layer (HTL), or may include the HTL and a hole injection layer (HIL). The second functional layer 222c may include an electron transport layer (ETL) and/or an electron injection layer (EIL). In some embodiments, the second functional layer 222c may be omitted.

The opposite electrode 223 may be arranged above the first emission layer 222b1 and the second emission layer 222b2. An opposite electrode 223 may include a conductive material having a low work function. For example, the opposite electrode 223 may include a (semi)transparent layer including Ag, Mg, Al, Pt, Pd, Au, Ni, Nd, Ir, Cr, Li, Ca, or any alloys thereof. In some embodiments, the opposite electrode 223 may further include a layer including ITO, IZO, ZnO or $In_2O_3$, above the (semi)transparent layer including the aforedescribed material.

In some embodiments, a capping layer (not shown) may be further arranged above the opposite electrode 223. The capping layer may include LiF, an inorganic material, and/or an organic material.

The encapsulation layer 300 may be arranged above the display element layer 220. The encapsulation layer 300 may cover the first organic light-emitting diode OLED1 and the second organic light-emitting diode OLED2. In an embodiment, the encapsulation layer 300 may include at least one inorganic encapsulation layer and at least one organic encapsulation layer.

In FIGS. 13A and 13B, the encapsulation layer 300 includes a first inorganic encapsulation layer 310, an organic encapsulation layer 320, and a second inorganic encapsulation layer 330 that are sequentially stacked. In an embodiment, the first inorganic encapsulation layer 310 may include an inorganic material. For example, the first inorganic encapsulation layer 310 may include SiON. In an embodiment, the second inorganic encapsulation layer 330 may include an inorganic material. For example, the second inorganic encapsulation layer 330 may include $SiN_x$.

In an embodiment, a thickness of the organic encapsulation layer 320 may be about 20 μm. The thickness of the organic encapsulation layer 320 may be a distance between an upper surface of the first inorganic encapsulation layer 310 and a lower surface of the second inorganic encapsulation layer 330, the first inorganic encapsulation layer 310 and the second inorganic encapsulation layer 330 overlapping the first opening OP1 or the second opening OP2 in a plan view. In an embodiment, the thickness of the organic encapsulation layer 320 may be greater than about 20 μm. In an embodiment, the thickness of the organic encapsulation layer 320 may be less than about 20 μm.

The at least one inorganic encapsulation layer may include one or more inorganic materials from among $Al_2O_3$, $TiO_2$, $Ta_2O_5$, $HfO_2$, ZnO, $SiO_2$, $SiN_x$, and SiON. In an embodiment, the first inorganic encapsulation layer 310 may include SiON. The second inorganic encapsulation layer 330 may include $SiN_x$.

The at least one organic encapsulation layer may include a polymer-based material. The polymer-based material may include an acryl-based resin, an epoxy-based resin, polyimide, polyethylene, etc. In an embodiment, the at least one organic encapsulation layer may include acrylate.

The first light-shielding pattern LBP1 may be arranged above the display element layer 220. In an embodiment, the first light-shielding pattern LBP1 may be arranged above the at least one inorganic encapsulation layer. In an embodiment, the first light-shielding pattern LBP1 may be arranged above the second inorganic encapsulation layer 330. The first light-shielding pattern LBP1 may overlap the pixel-defining layer 225 in a plan view.

The first light-shielding pattern LBP1 may overlap one of the first display area DA1 and the second display area DA2. For example, the first light-shielding pattern LBP1 may overlap the first display area DA1 and may not overlap the second display area DA2. In another example, the first light-shielding pattern LBP1 may not overlap the first display area DA1 and may overlap the second display area DA2 in a plan view. A case where the first light-shielding pattern LBP1 overlaps the first display area DA1 and does not overlap the second display area DA2 will be mainly described in detail below.

The first light-shielding pattern LBP1 may define a first hole H1 that overlaps one of the first organic light-emitting diode OLED1 as a first display element and the second organic light-emitting diode OLED2 as a second display element. For example, the first light-shielding pattern LBP1 may define the first hole H1 overlapping the first organic light-emitting diode OLED1. In other words, the first hole H1 may overlap the first sub-pixel P1. The first hole H1 may overlap the first pixel electrode 221A in a plan view. The first hole H1 may penetrate through the first light-shielding pattern LBP1.

In an embodiment, a size of the first opening OP1 may be equal to a size of the first hole H1. The size of the first hole H1 may be defined as an area of the first hole H1. In an embodiment, the first opening OP1 and the first hole H1 may have substantially the same size. In an embodiment, the width of the first opening OP1 may be equal to a width Hw1 of the first hole H1. The width Hw1 of the first hole H1 may be a shortest distance between portions of the first light-shielding pattern LBP1 defining the first hole H1.

Light emitted by the first organic light-emitting diode OLED1 may be emitted in the third direction (for example, the z direction or the −z direction). The light emitted by the first organic light-emitting diode OLED1 may reach a user of the display device, but may not reach another person around the user. In other words, the display device may provide a narrow viewing angle in the first display area DA1.

Light emitted by the second organic light-emitting diode OLED2 may be emitted in the third direction (for example, the z direction or the −z direction). In addition, the light emitted by the second organic light-emitting diode OLED2 may be emitted in a direction oblique to the third direction (for example, the z direction or the −z direction), and a viewing angle, which is an angle at which an image may be recognized or viewed without image quality distortion, may increase around the third direction (for example, the z direction or the −z direction).

The planarization layer PLL may be arranged above at least one inorganic encapsulation layer. An upper surface of the planarization layer PLL may be approximately flat and may include an organic material, such as acryl, BCB, or HMDSO. In an embodiment, the planarization layer PLL may include a first planarization layer PLL1 and a second planarization layer PLL2 above the first planarization layer PLL1. In an embodiment, the first planarization layer PLL1 and the second planarization layer PLL2 may overlap the first display area DA1 and the second display area DA2 in a plan view.

In an embodiment, the first planarization layer PLL1 may be arranged between the first light-shielding pattern LBP1 and the at least one inorganic encapsulation layer. In other words, the first planarization layer PLL1 may be arranged above the at least one inorganic encapsulation layer, and the first light-shielding pattern LBP1 may be arranged above the first planarization layer PLL1. For example, the first planarization layer PLL1 may be arranged above the second inorganic encapsulation layer 330, and the first light-shielding pattern LBP1 may be arranged above the first planarization layer PLL1. In some embodiments, the first planarization layer PLL1 may be omitted.

The second planarization layer PLL2 may be arranged above the first light-shielding pattern LBP1. The second planarization layer PLL2 may fill the first hole H1 of the first light-shielding pattern LBP1.

Referring to FIG. 13B, the display panel 10 may further include a second light-shielding pattern LBP2. The second light-shielding pattern LBP2 may overlap the other one of the first display area DA1 and the second display area DA2 in a plan view. For example, the second light-shielding pattern LBP2 may not overlap the first display area DA1 and may overlap the second display area DA2. In other words, when the first light-shielding pattern LBP1 overlaps the first display area DA1, the second light-shielding pattern LBP2 may overlap the second display area DA2.

The second light-shielding pattern LBP2 may define a second hole H2 that overlaps the other one from among the first organic light-emitting diode OLED1 as a first display element and the second organic light-emitting diode OLED2 as a second display element in a plan view. For example, the second light-shielding pattern LBP2 may define the second hole H2 overlapping the second organic light-emitting diode OLED2. In other words, the second hole H2 may overlap the second sub-pixel P2. The second hole H2 may overlap the second pixel electrode 221B. The second hole H2 may penetrate through the second light-shielding pattern LBP2.

A ratio of a size (i.e., area) of the first hole H1 to a size of the first sub-pixel P1 may be less than a ratio of a size of the second hole H2 to a size of the second sub-pixel P2. When the size of the first sub-pixel P1 is X and the size of the first hole H1 is Y, a ratio of the size of the first hole H1 to the size of the first sub-pixel P1 may be Y/X. When the size of the second sub-pixel P2 is Z and the size of the second hole H2 is W, a ratio of the size of the second hole H2 to the size of the second sub-pixel P2 may be W/Z. The size of the second hole H2 may be defined as an area of the second hole H2 in a plan view.

A ratio of the width Hw1 of the first hole H1 to the width w1 of the first sub-pixel P1 in the first direction (i.e., x direction) may be less than a ratio of a width Hw2 of the second hole H2 to the width w2 of the second sub-pixel P2. When the width w1 of the first sub-pixel P1 is X and the width Hw1 of the first hole H1 is Y, a ratio of the width Hw1 of the first hole H1 to the width w1 of the first sub-pixel P1 may be Y/X. When the width w2 of the second sub-pixel P2 in the first direction (i.e., x direction) is Z and the width Hw2 of the second hole H2 is W, a ratio of the width Hw2 of the second hole H2 to the width w2 of the second sub-pixel P2 may be W/Z. The width Hw2 of the second hole H2 may be defined as a shortest distance between portions of the second light-shielding pattern LBP2 defining the second hole H2.

The size of the first sub-pixel P1 may be equal to the size of the first hole H1. In an embodiment, the first sub-pixel P1 may be equal in size to the first hole H1. In an embodiment, the width w1 of the first sub-pixel P1 may be equal to the width Hw1 of the first hole H1.

Light emitted by the first sub-pixel P1 may be emitted in the third direction (for example, the z direction or the −z direction) and/or a direction substantially same as the third direction (for example, the z direction or the −z direction). The light emitted by the first sub-pixel P1 may reach a user of the display device, but may not reach another person around the user. In other words, the display device may provide a narrow viewing angle in the first display area DA1.

The size of the second sub-pixel P2 may be less than the size of the second hole H2. In an embodiment, the second sub-pixel P2 may be arranged inside the second hole H2. In an embodiment, the width w2 of the second sub-pixel P2 may be less than the width Hw2 of the second hole H2.

Because the size of the second sub-pixel P2 is less than the size of the second hole H2, light emitted by the second sub-pixel P2 may be emitted in the third direction (for example, the z direction or the −z direction), which is perpendicular to the first direction (for example, the x direction or the −x direction) and the second direction (for example, the y direction or the −y direction). In addition, the light emitted by the second sub-pixel P2 may be emitted in a direction oblique to the third direction (for example, the z direction or the −z direction). Thus, a viewing angle, which is an angle at which an image may be recognized or viewed without image quality distortion, may increase around the third direction (for example, the z direction or the −z direction).

In an embodiment, only the first organic light-emitting diode OLED1 arranged in the first display area DA1 emits light, and the second organic light-emitting diode OLED2 arranged in the second display area DA2 may not emit light. In this case, light emitted from the display device may not reach another person around the user of the display device. In an embodiment, each of the first organic light-emitting diode OLED1 arranged in the first display area DA1 and the second organic light-emitting diode OLED2 arranged in the second display area DA2 may emit light. In this case, the light emitted from the display device may also reach another person around the user of the display device.

The first planarization layer PLL1 may be arranged above the at least one inorganic encapsulation layer, and the first light-shielding pattern LBP1 and the second light-shielding pattern LBP2 may be arranged above the first planarization layer PLL1. For example, the first planarization layer PLL1 may be arranged above the second inorganic encapsulation layer 330, and the first light-shielding pattern LBP1 and the second light-shielding pattern LBP2 may be arranged above the first planarization layer PLL1.

The second planarization layer PLL2 may be arranged above the first light-shielding pattern LBP1 and the second light-shielding pattern LBP2. The second planarization layer PLL2 may fill the first hole H1 of the first light-shielding pattern LBP1 and the second hole H2 of the second light-shielding pattern LBP2.

Figure 14A:
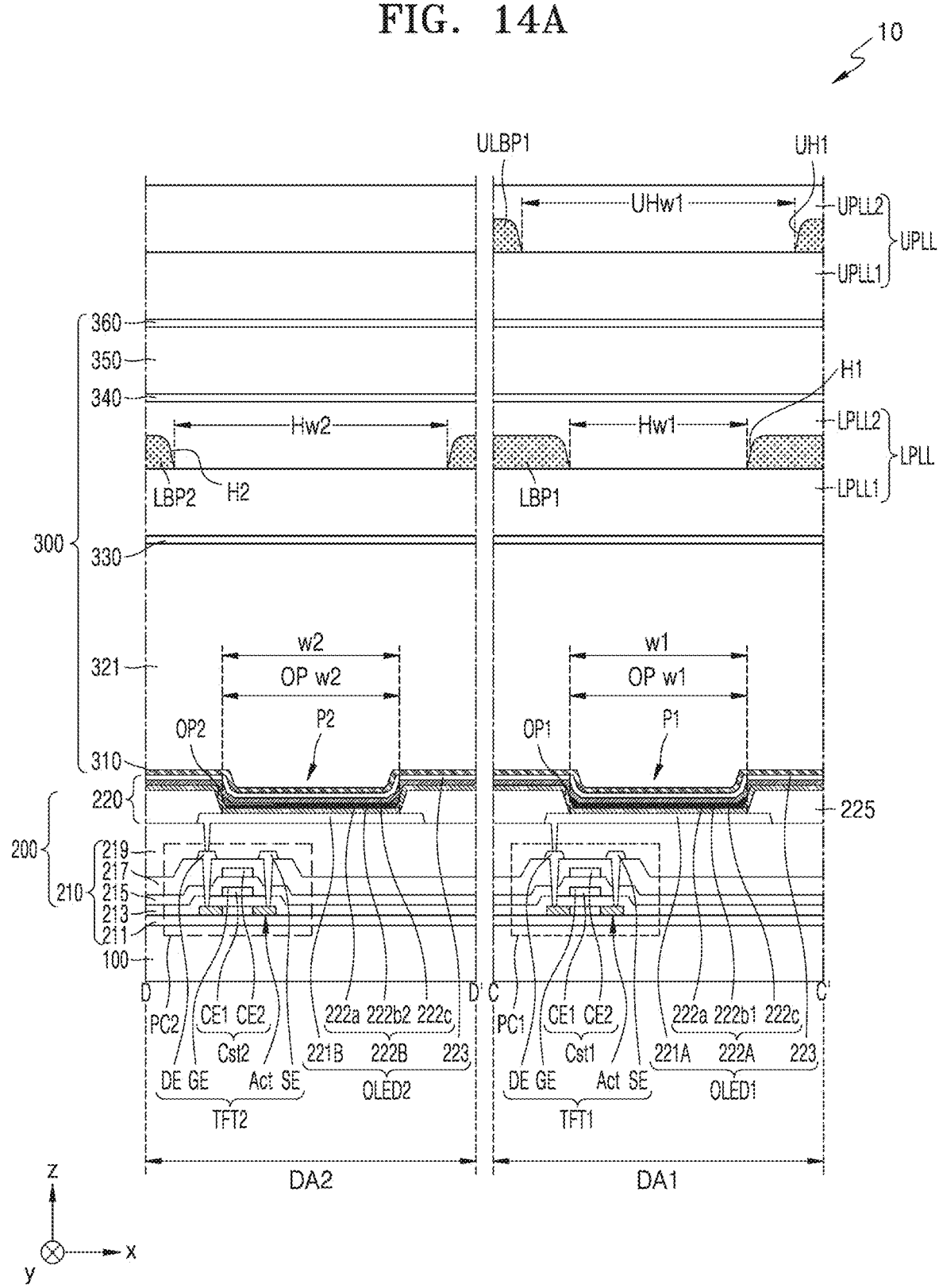
FIGS. 14A to 14C are cross-sectional views of a display panel according to various embodiments.
Figure 14B:
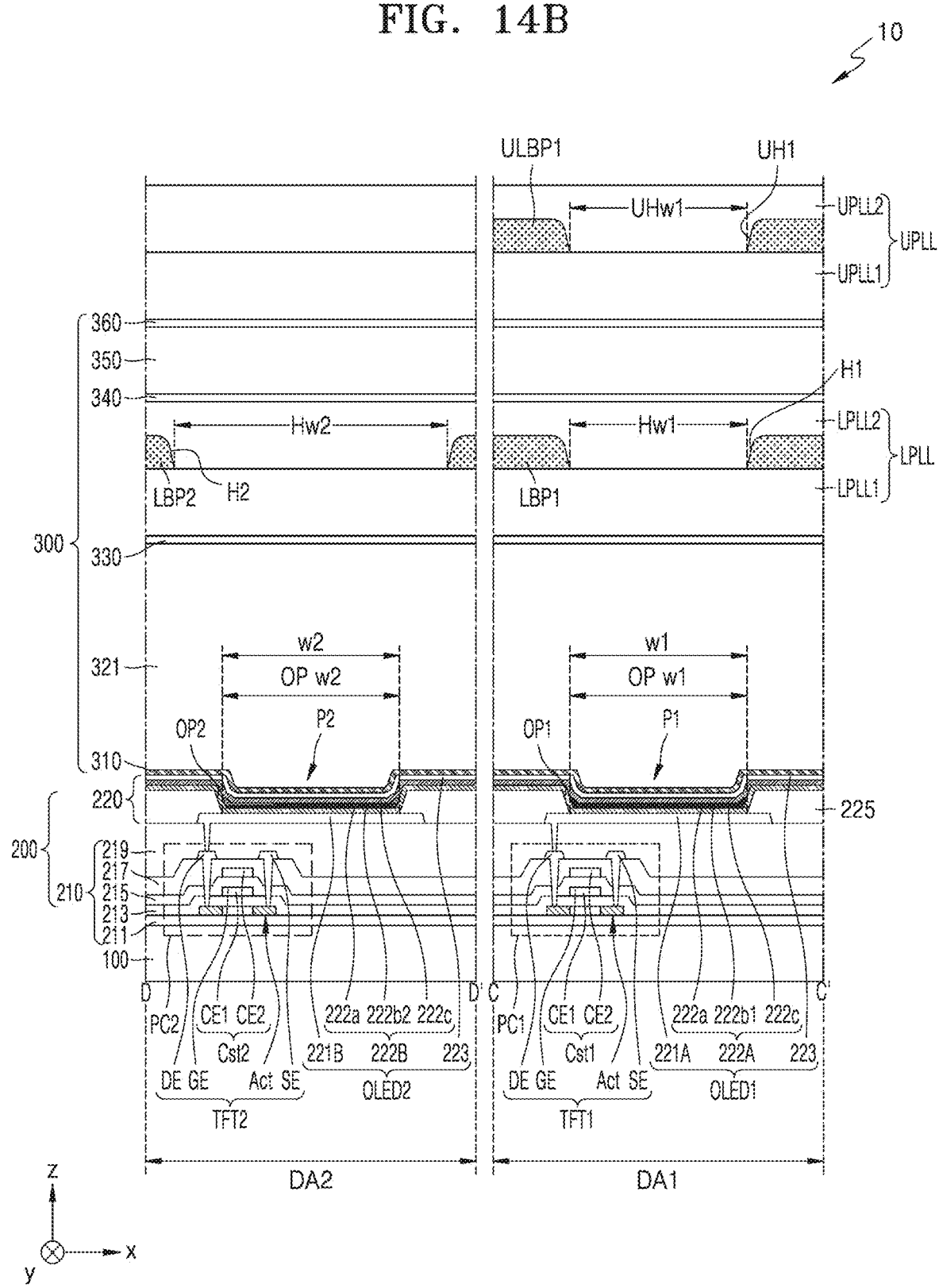
Figure 14C:
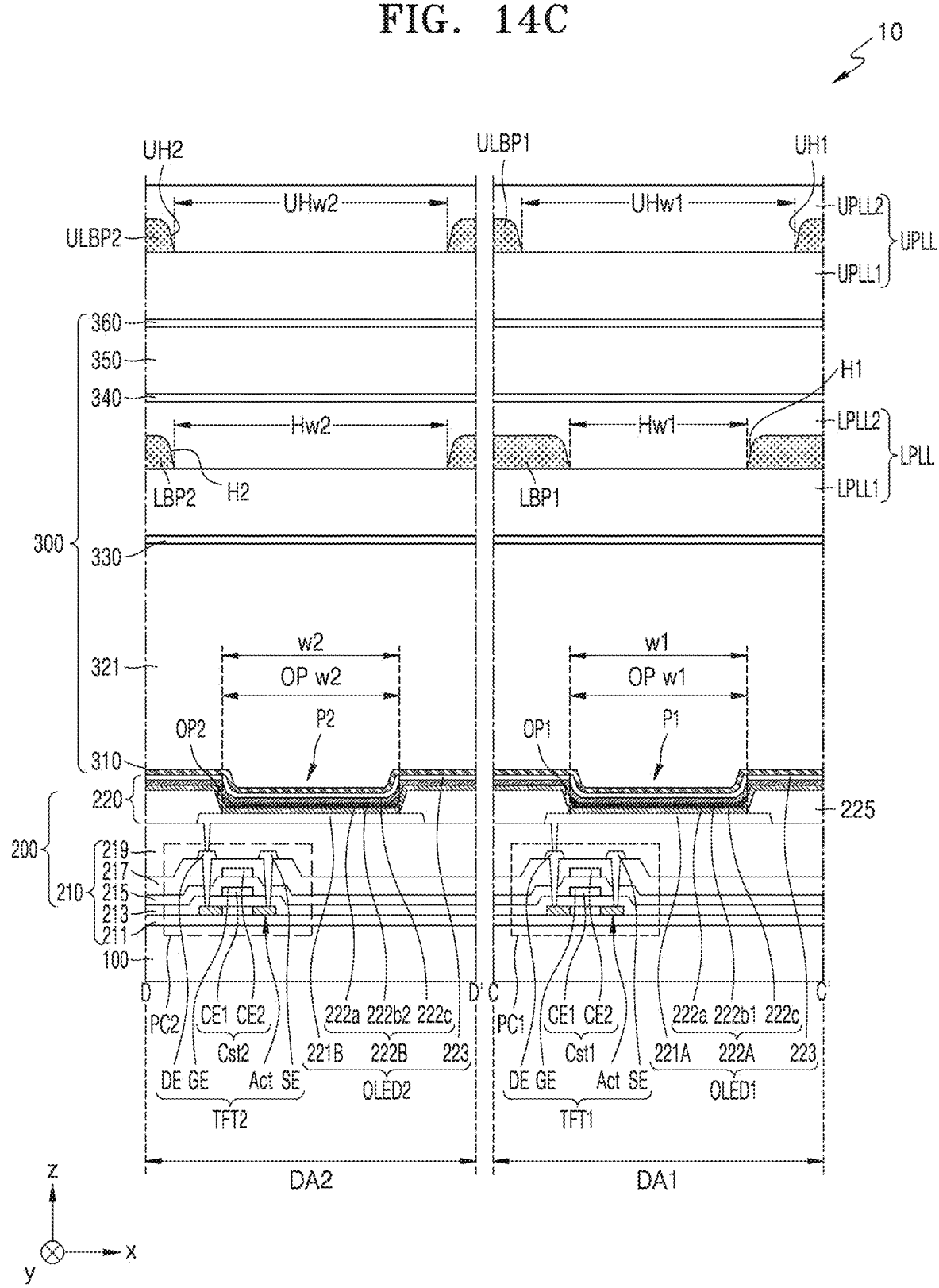

FIGS. 14A to 14C are cross-sectional views of a display panel 10 according to various embodiments. FIGS. 14A to 14C are cross-sectional views of the display panel in FIG. 12, taken along lines C-C' and D-D'. In FIGS. 14A and 14C, the same reference numerals as those of FIG. 13B denote the same elements, and redundant descriptions thereof will be omitted.

Referring to FIGS. 14A to 14C, the display panel 10 may include a substrate 100, a pixel circuit layer 210, a display element layer 220, an encapsulation layer 300, a first light-shielding pattern LBP1, a second light-shielding pattern LBP2, a lower planarization layer LPLL, and an upper planarization layer UPLL.

Referring to FIGS. 14A to 14C, the encapsulation layer 300 may include a first inorganic encapsulation layer 310, a first organic encapsulation layer 321, a second inorganic encapsulation layer 330, a third inorganic encapsulation layer 340, a second organic encapsulation layer 350, and a fourth inorganic encapsulation layer 360 that are sequentially stacked. The first inorganic encapsulation layer 310, the first organic encapsulation layer 321, and the second inorganic encapsulation layer 330 may be sequentially stacked above the display element layer 220.

In an embodiment, the first inorganic encapsulation layer 310 may include an inorganic material. For example, the first inorganic encapsulation layer 310 may include SiON. In an embodiment, the second inorganic encapsulation layer 330 may include an inorganic material. For example, the second inorganic encapsulation layer 330 may include $SiN_x$.

In an embodiment, a thickness of the first organic encapsulation layer 321 may be about 8.8 μm. The thickness of the first organic encapsulation layer 321 may correspond to a distance between an upper surface of the first inorganic encapsulation layer 310 and a lower surface of the second inorganic encapsulation layer 330, the first inorganic encapsulation layer 310 and the second inorganic encapsulation layer 330 overlapping the first opening OP1 or the second opening OP2 in a plan view. In an embodiment, the thickness of the first organic encapsulation layer 321 may be greater than about 8.8 μm. In an embodiment, the thickness of the first organic encapsulation layer 321 may be less than about 8.8 μm.

In an embodiment, the first light-shielding pattern LBP1 may be arranged above at least one inorganic encapsulation layer. For example, the first light-shielding pattern LBP1 may be arranged between the second inorganic encapsulation layer 330 and the third inorganic encapsulation layer 340.

The first light-shielding pattern LBP1 may overlap one from among a first display area DA1 and a second display area DA2 in a plan view. For example, the first light-shielding pattern LBP1 may overlap the first display area DA1 and may not overlap the second display area DA2.

The second light-shielding pattern LBP2 may overlap the other one from among the first display area DA1 and the second display area DA2. For example, the second light-shielding pattern LBP2 may not overlap the first display area DA1 and may overlap the second display area DA2. In other words, when the first light-shielding pattern LBP1 overlaps the first display area DA1, the second light-shielding pattern LBP2 may overlap the second display area DA2 in a plan view. In some embodiments, the second light-shielding pattern LBP2 may be omitted.

The lower planarization layer LPLL may be arranged above at least one inorganic encapsulation layer. In an embodiment, the lower planarization layer LPLL may be arranged between the second inorganic encapsulation layer 330 and the third inorganic encapsulation layer 340.

An upper surface of the lower planarization layer LPLL may be approximately flat and may include an inorganic material such as BCB or HMDSO. In an embodiment, the lower planarization layer LPLL may include a first lower planarization layer LPLL1 and a second lower planarization layer LPLL2 above the first lower planarization layer LPLL1.

In an embodiment, the first lower planarization layer LPLL1 may be arranged between the first light-shielding pattern LBP1 and the second inorganic encapsulation layer 330. In other words, the first lower planarization layer LPLL1 may be arranged above the second inorganic encapsulation layer 330, and the first light-shielding pattern LBP1 and the second light-shielding pattern LBP2 may be arranged above the first lower planarization layer LPLL1. In some embodiments, the first lower planarization layer LPLL1 may be omitted.

The second lower planarization layer LPLL2 may be arranged above the first light-shielding pattern LBP1 and the second light-shielding pattern LBP2. The second lower planarization layer LPLL2 may fill the first hole H1 of the first light-shielding pattern LBP1 and the second hole H2 of the second light-shielding pattern LBP2.

The third inorganic encapsulation layer 340, the second organic encapsulation layer 350, and the fourth inorganic encapsulation layer 360 may be sequentially stacked above the second lower planarization layer LPLL2. In an embodiment, the third inorganic encapsulation layer 340 may include an inorganic material. For example, the third inorganic encapsulation layer 340 may include SiON. In an embodiment, the fourth inorganic encapsulation layer 360 may include an inorganic material. For example, the fourth inorganic encapsulation layer 360 may include $SiN_x$.

In an embodiment, a thickness of the second organic encapsulation layer 350 may be about 8.8 µm. The thickness of the second organic encapsulation layer 350 may correspond to a distance between an upper surface of the third inorganic encapsulation layer 340 and a lower surface of the fourth inorganic encapsulation layer 360. In an embodiment, the thickness of the second organic encapsulation layer 350 may be greater than about 8.8 µm. In an embodiment, the thickness of the second organic encapsulation layer 350 may be less than about 8.8 µm.

A first upper light-shielding pattern ULBP1 may be arranged above the fourth inorganic encapsulation layer 360. The first upper light-shielding pattern ULBP1 may at least partially absorb external light or internal reflected light. The first upper light-shielding pattern ULBP1 may include a black pigment. The first upper light-shielding pattern ULBP1 may include a black matrix. The first upper light-shielding pattern ULBP1 may be arranged in the first display area DA1. The first upper light-shielding pattern ULBP1 may be arranged above the first light-shielding pattern LBP1. In an embodiment, the first upper light-shielding pattern ULBP1 may not be arranged in the second display area DA2.

The first upper light-shielding pattern ULBP1 may define a first upper hole UH1. The first upper hole UH1 may penetrate through the first upper light-shielding pattern ULBP1. The first upper hole UH1 may overlap the first display area DA1 in a plan view. The first upper hole UH1 may overlap the first hole H1.

The first upper light-shielding pattern ULBP1 may be arranged farther away from the first organic light-emitting diode OLED1 than the first light-shielding pattern LBP1. In this case, the first upper light-shielding pattern ULBP1 may reduce the progress of light emitted by the first organic light-emitting diode OLED1 in a direction oblique with respect to the third direction (for example, the z direction or the −z direction). Thus, light progressing in a direction oblique with respect to the third direction (for example, the z direction or the −z direction) from the first organic light-emitting diode OLED1 may be at least partially removed. The light emitted by the first organic light-emitting diode OLED1 may reach a user of the display device, but may not reach another person around the user. In other words, the display panel 10 and/or the display device may provide a narrow viewing angle in the first display area DA1.

Referring to FIG. 14A, a size of the first upper hole UH1 may be greater than a size of the first hole H1. The size of the first upper hole UH1 may be defined as an area occupied by the first upper hole UH1. A width UHw1 of the first upper hole UH1 may be greater than the width Hw1 of the first hole H1. The width UHw1 of the first upper hole UH1 may be defined as a shortest distance between portions of the first upper light-shielding pattern ULBP1 defining the first upper hole UH1.

In the present embodiment, the size of the first upper hole UH1 is greater than the size of the first hole H1, and thus, a reflectance difference between a reflectance of the display device in the first display area DA1 and a reflectance of the display device in the second display area DA2 may be reduced.

Referring to FIG. 14B, the size of the first upper hole UH1 may be less than or equal to the size of the first hole H1. The width UHw1 of the first upper hole UH1 may be less than or equal to the width Hw1 of the first hole H1. In this case, the display device may provide a narrower viewing angle in the second display area DA2.

The upper planarization layer UPLL may be arranged above at least one inorganic encapsulation layer. An upper surface of the upper planarization layer UPLL may be approximately flat and may include an inorganic material such as acryl, BCB, or HMDSO. In an embodiment, the upper planarization layer UPLL may include a first upper planarization layer UPLL1 and a second upper planarization layer UPLL2 above the first upper planarization layer UPLL1. In an embodiment, the first upper planarization layer UPLL1 and the second upper planarization layer UPLL2 may overlap the first display area DA1 and the second display area DA2 in a plan view.

In an embodiment, the first upper planarization layer UPLL1 may be arranged between the fourth inorganic encapsulation layer 360 and the first upper light-shielding pattern ULBP1. In other words, the first upper planarization layer UPLL1 may be arranged above the fourth inorganic encapsulation layer 360, and the first upper light-shielding pattern ULBP1 may be arranged above the first upper planarization layer UPLL1. For example, the first upper planarization layer UPLL1 may be arranged above the fourth inorganic encapsulation layer 360, and the first upper light-shielding pattern ULBP1 may be arranged above the first upper planarization layer UPLL1. In some embodiments, the first upper planarization layer UPLL1 may be omitted.

The second upper planarization layer UPLL2 may be arranged above the first upper light-shielding pattern ULBP1. The second upper planarization layer UPLL2 may fill the first upper hole UH1 of the first upper light-shielding pattern ULBP1.

Referring to FIG. 14C, a second upper light-shielding pattern ULBP2 may be arranged above the fourth inorganic encapsulation layer 360. The second upper light-shielding pattern ULBP2 may at least partially absorb external light or internal reflected light. The second upper light-shielding pattern ULBP2 may include a black pigment. The second upper light-shielding pattern ULBP2 may include a black matrix. The second upper light-shielding pattern ULBP2 may not be arranged in the first display area DA1. In an embodiment, the second upper light-shielding pattern ULBP2 may be arranged in the second display area DA2.

The second upper light-shielding pattern ULBP2 may define a second upper hole UH2. The second upper hole UH2 may penetrate through the second upper light-shielding pattern ULBP2. The second upper hole UH2 may overlap the second display area DA2 in a plan view. The second upper hole UH2 may overlap the second hole H2.

A size of the second hole H2 may be greater than or equal to the size of the second hole H2. The size of the second upper hole UH2 may be defined as an area occupied by the second upper hole UH2. A width UHw2 of the second upper hole UH2 may be greater than the width Hw2 of the second hole H2. The width UHw2 of the second upper hole UH2 may be defined as a shortest distance between portions of the second upper light-shielding pattern ULBP2 defining the second upper hole UH2. Thus, the second display area DA2 may maintain a wide viewing angle.

In the present embodiment, the second upper light-shielding pattern ULBP2 is arranged in the second display area DA2, and thus, a reflectance difference between a reflectance of the display device in the first display area DA1 and a reflectance of the display device in the second display area DA2 may be reduced.

The first upper planarization layer UPLL1 may be arranged above the fourth inorganic encapsulation layer 360, and the first upper light-shielding pattern ULBP1 and the second upper light-shielding pattern ULBP2 may be arranged above the first upper planarization layer UPLL1. For example, the first upper planarization layer UPLL1 may be arranged above the fourth inorganic encapsulation layer 360, and the first upper light-shielding pattern ULBP1 and the second upper light-shielding pattern ULBP2 may be arranged above the first upper planarization layer UPLL1.

The second upper planarization layer UPLL2 may be arranged above the first upper light-shielding pattern ULBP1 and the second upper light-shielding pattern ULBP2. The second upper planarization layer UPLL2 may fill the first upper hole UH1 of the first upper light-shielding pattern ULBP1 and the second upper hole UH2 of the second upper light-shielding pattern ULBP2.

As described above, the embodiments of the present disclosure include at least one of a lower light-shielding layer and an upper light-shielding layer that are arranged above an encapsulation layer, and thus, the progress of light emitted by a display element in a direction oblique to a front surface of a display device may be reduced.

In addition, in the embodiments of the present disclosure, an inorganic layer is formed above an organic layer, and thus, damage to the organic layer when the upper light-shielding layer is formed may be prevented or reduced.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope including the following claims.

What is claimed is:

1. A display device comprising:
   a substrate;
   a display layer arranged above the substrate and comprising a display element;
   an encapsulation layer above the display layer;
   a lower light-shielding layer above the encapsulation layer;
   an upper light-shielding layer at least partially overlapping the lower light-shielding layer in a thickness direction of the substrate and arranged above the lower light-shielding layer;
   an organic layer arranged between the lower light-shielding layer and the upper light-shielding layer and separating the lower light-shielding layer and the upper light-shielding layer from each other; and
   an inorganic layer between the upper light-shielding layer and the organic layer in the thickness direction of the substrate.

2. The display device of claim 1, wherein a thickness of the organic layer is greater than a thickness of the inorganic layer.

3. The display device of claim 1, wherein the encapsulation layer comprises at least one organic encapsulation layer and at least one inorganic encapsulation layer, and
   a thickness of the organic layer is greater than a thickness of the at least one organic encapsulation layer.

4. The display device of claim 1, further comprising a touch conductive layer above the encapsulation layer,
   wherein the lower light-shielding layer covers the touch conductive layer.

5. The display device of claim 4, further comprising a touch insulating layer between the lower light-shielding layer and the organic layer.

6. The display device of claim 5, wherein a thickness of the organic layer is greater than a thickness of the touch insulating layer.

7. The display device of claim 4, wherein the touch conductive layer defines a conductive layer hole overlapping the display element in the thickness direction of the substrate.

8. The display device of claim 1, wherein the display element comprises a pixel electrode, an emission layer, and an opposite electrode,
   the display layer comprises a pixel-defining layer which covers an edge of the pixel electrode and defines an opening overlapping a central portion of the pixel electrode in the thickness direction of the substrate, and at least one of the lower light-shielding layer and the upper light-shielding layer overlaps the pixel-defining layer in the thickness direction of the substrate.

9. The display device of claim 1, further comprising a planarization layer covering the upper light-shielding layer.

10. A display device comprising:
a substrate;
a display layer arranged above the substrate and comprising a display element;
an encapsulation layer arranged above the display layer and comprising at least one inorganic encapsulation layer and at least one organic encapsulation layer;
an organic layer arranged above the encapsulation layer and having a thickness greater than a thickness of the at least one organic encapsulation layer;
an inorganic layer above the organic layer in a thickness direction of the substrate; and
at least one of a lower light-shielding layer arranged between the encapsulation layer and the organic layer, but not contacting the organic layer, and an upper light-shielding layer arranged above the inorganic layer, which is disposed between the upper light-shielding layer and the organic layer in the thickness direction of the substrate.

11. The display device of claim 10, further comprising:
a touch conductive layer between the encapsulation layer and the organic layer; and
a touch insulating layer covering the touch conductive layer.

12. The display device of claim 11, wherein the lower light-shielding layer covers the touch conductive layer, and the touch insulating layer covers the lower light-shielding layer.

13. The display device of claim 10, wherein the display element comprises a pixel electrode, an emission layer, and an opposite electrode,
the display layer comprises a pixel-defining layer which covers an edge of the pixel electrode and defines an opening overlapping a central portion of the pixel electrode in a thickness direction of the substrate, and
at least one of the lower light-shielding layer and the upper light-shielding layer overlaps the pixel-defining layer in the thickness direction of the substrate.

14. The display device of claim 10, further comprising a planarization layer covering the upper light-shielding layer.

15. A display device comprising:
a substrate comprising a first display area and a second display area adjacent to the first display area;
a display layer comprising a first display element including a first pixel electrode arranged in the first display area, a second display element including a second pixel electrode arranged in the second display area, and a pixel-defining layer defining a first opening and a second opening overlapping the first pixel electrode and the second pixel electrode, respectively, in a thickness direction of the substrate;
an encapsulation layer arranged above the display layer and comprising at least one inorganic encapsulation layer and at least one organic encapsulation layer; and
a first light-shielding pattern arranged above the at least one inorganic encapsulation layer, overlapping one of the first display area and the second display area in the thickness direction of the substrate, and defining a first hole overlapping one of the first display element and the second display element in the thickness direction of the substrate; and
a first upper light-shielding pattern arranged above the first light-shielding pattern and defining a first upper hole overlapping the first hole in the thickness direction of the substrate,
wherein the first display area is absent any other light-shielding member overlapping the first display area other than the first light-shielding pattern,
wherein the encapsulation layer comprises a first inorganic encapsulation layer, a first organic encapsulation layer, a second inorganic encapsulation layer, a third inorganic encapsulation layer, a second organic encapsulation layer, and a fourth inorganic encapsulation layer that are sequentially stacked,
wherein the second organic encapsulation layer is arranged above the first light-shielding pattern, and
wherein the fourth inorganic encapsulation layer is disposed between the first upper light-shielding pattern and the second organic encapsulation layer in the thickness direction of the substrate.

16. The display device of claim 15, wherein the first light-shielding pattern is arranged in the first display area, the first hole overlaps the first display element in the thickness direction of the substrate, and
a width of the first opening is equal to a width of the first hole.

17. The display device of claim 15, wherein the first light-shielding pattern is arranged between the second inorganic encapsulation layer and the third inorganic encapsulation layer.

18. The display device of claim 15, further comprising a second light-shielding pattern arranged above the at least one inorganic encapsulation layer, overlapping another one of the first display area and the second display area in the thickness direction of the substrate, and defining a second hole overlapping another one of the first display element and the second display element in the thickness direction of the substrate, and
wherein a ratio (Y/X) of a width of the first hole (Y) to a width (X) of the first opening is less than a ratio (W/Z) of a width (W) of the second hole to a width (Z) of the second opening.

* * * * *